(12) United States Patent
Choi et al.

(10) Patent No.: US 12,364,129 B2
(45) Date of Patent: Jul. 15, 2025

(54) ORGANIC LIGHT-EMITTING DISPLAY DEVICE

(71) Applicant: Samsung Display Co., Ltd., Yongin-si (KR)

(72) Inventors: Jin Young Choi, Hwaseong-si (KR); Sang Hoon Yim, Suwon-si (KR); Dong Hoon Kim, Suwon-si (KR); Jin Sook Bang, Hwaseong-si (KR); Jin Wook Jeong, Asan-si (KR); Eun Jeong Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 468 days.

(21) Appl. No.: 17/197,970

(22) Filed: Mar. 10, 2021

(65) Prior Publication Data

US 2021/0313536 A1 Oct. 7, 2021

(30) Foreign Application Priority Data

Apr. 1, 2020 (KR) .................. 10-2020-0039612

(51) Int. Cl.
*H10K 59/35* (2023.01)
*H10K 50/12* (2023.01)
(Continued)

(52) U.S. Cl.
CPC ............ *H10K 59/35* (2023.02); *H10K 50/12* (2023.02); *H10K 50/15* (2023.02); *H10K 50/16* (2023.02);
(Continued)

(58) Field of Classification Search
CPC ........ H10K 50/15; H10K 50/12; H10K 50/16; H10K 50/171
See application file for complete search history.

(56) References Cited

U.S. PATENT DOCUMENTS 5,834,893 A * 11/1998 Bulovic ............... H10K 50/856
428/917
7,888,865 B2 * 2/2011 Iwakuma ............. H10K 50/125
313/506

(Continued)

FOREIGN PATENT DOCUMENTS

KR 2003-0019057 3/2003
KR 2003-0067547 8/2003

(Continued)

OTHER PUBLICATIONS

Akanksha Jetly et al., "Efficient Tandem Organic Light Emitting Diode Using Organic Photovoltaic Charge Generation Layer," International Journal of Optics, vol. 2018, pp. 1-11, Sep. 26, 2018.

(Continued)

*Primary Examiner* — Erik Kielin
(74) *Attorney, Agent, or Firm* — Womble Bond Dickinson (US) LLP

(57) ABSTRACT

An organic light-emitting display device includes: a plurality of pattern electrodes; a hole-transporting layer disposed on the plurality of pattern electrodes; a plurality of emission layers disposed on the hole-transporting layer and overlapping the plurality of pattern electrodes, respectively; a common electrode disposed on the emission layers; and a first auxiliary layer disposed between a first one of the pattern electrodes and a first one of the emission layers, wherein the first emission layer forms an interface with the hole-transporting layer or the first auxiliary layer, the interface having a hole barrier equal to or less than about 0.1 eV, wherein the hole-transporting layer and the first auxiliary layer have a hole mobility equal to or less than about $1.0 \times 10^{-3}$ cm$^2$/V·s.

18 Claims, 4 Drawing Sheets

(51) Int. Cl.
*H10K 50/15* (2023.01)
*H10K 50/16* (2023.01)
*H10K 50/17* (2023.01)
*H10K 59/80* (2023.01)
*H10K 101/20* (2023.01)

(52) U.S. Cl.
CPC .......... *H10K 50/171* (2023.02); *H10K 50/17* (2023.02); *H10K 59/876* (2023.02); *H10K 2101/20* (2023.02)

(56) References Cited

U.S. PATENT DOCUMENTS

| | | | |
|---|---|---|---|
| 9,093,650 B2 | 7/2015 | Kim et al. | |
| 9,825,107 B2 | 11/2017 | Park et al. | |
| 9,905,616 B2 | 2/2018 | Song et al. | |
| 10,243,147 B2 | 3/2019 | Huang et al. | |
| 10,326,111 B2 | 6/2019 | Yoo et al. | |
| 2002/0121860 A1* | 9/2002 | Seo | H10K 77/10 313/506 |
| 2003/0048072 A1 | 3/2003 | Ishihara et al. | |
| 2003/0146693 A1 | 8/2003 | Ishihara et al. | |
| 2005/0156520 A1 | 7/2005 | Tanaka et al. | |
| 2008/0105870 A1* | 5/2008 | Yu | H10N 70/00 257/E47.001 |
| 2008/0284324 A1* | 11/2008 | Chun | H10K 50/17 257/E51.027 |
| 2011/0140090 A1* | 6/2011 | Jeong | H10K 50/858 257/40 |
| 2013/0182004 A1 | 7/2013 | Cho et al. | |
| 2014/0231768 A1 | 8/2014 | Adamovich et al. | |
| 2015/0303384 A1* | 10/2015 | Kim | C07D 405/10 548/440 |
| 2015/0349272 A1 | 12/2015 | Park et al. | |
| 2016/0087225 A1* | 3/2016 | Kim | H10K 85/654 257/40 |
| 2017/0018600 A1 | 1/2017 | Ito et al. | |
| 2017/0155073 A1 | 6/2017 | Kim et al. | |
| 2017/0179400 A1* | 6/2017 | Hwang | H10K 85/636 |
| 2017/0200899 A1 | 7/2017 | Kim et al. | |
| 2017/0207416 A1 | 7/2017 | Kim et al. | |
| 2018/0047925 A1 | 2/2018 | Kim et al. | |
| 2019/0198789 A1 | 6/2019 | Kim et al. | |
| 2022/0384754 A1* | 12/2022 | Mizusaki | H10K 85/6572 |

FOREIGN PATENT DOCUMENTS

| | | |
|---|---|---|
| KR | 10-2005-0076581 | 7/2005 |
| KR | 10-2012-0004018 | 1/2012 |
| KR | 10-2013-0083308 | 7/2013 |
| KR | 10-1561566 | 10/2015 |
| KR | 10-2016-0047671 A | 5/2016 |
| KR | 10-2017-0003747 | 1/2017 |
| KR | 10-2017-0012085 A | 2/2017 |
| KR | 10-2017-0049782 A | 5/2017 |
| KR | 10-2017-0063310 | 6/2017 |
| KR | 10-2017-0137978 | 12/2017 |
| KR | 10-2018-0017901 | 2/2018 |
| KR | 10-2019-0076486 | 7/2019 |

OTHER PUBLICATIONS

Jun Yeob Lee et al., "Enhanced hole transport in C60-doped hole transport layer," Applied Physics Letter, pp. 1-4, May 1, 2006.

Jonghee Yang et al., "Mobility enhancement of hole transporting layer in quantum-dot light-emitting diodes incorporating single-walled carbon nanotubes," Diamond & Related Materials, pp. 154-160, Sep. 6, 2016.

Yongsheng Liu et al., Perovskite Solar Cells Employing Dopant-Free Organic Hole Transport Materials with Tunable Energy Levels, Advanced Materials, vol. 28, pp. 440-446, Nov. 20, 2015.

Ji Young Kim et al., "Quantitative Analysis of Charge Distribution in Bi-Emissive Layer White Organic Light-Emitting Diodes with Two Fluorescent Dopants," pp. 1-9, Feb. 16, 2018.

Hyunkoo Lee et al., Trap-Level-engineered common red layer for fabricating red, green, and blue subpixels of full color organic light-emitting diode displays, Optics Express, vol. 23, No. 9, pp. 1-12, Apr. 23, 2015.

\* cited by examiner

ORGANIC LIGHT-EMITTING DISPLAY DEVICE

CROSS REFERENCE TO RELATED APPLICATION

This application claims priority from and the benefit of Korean Patent Application No. 10-2020-0039612 filed on Apr. 1, 2020, which is hereby incorporated by reference for all purposes as if fully set forth herein.

BACKGROUND

Field

The invention relates generally to a display device, and more particularly, to an organic light-emitting display device.

Discussion of the Background

An organic light-emitting display device includes light-emitting elements including an organic light-emitting layer to generate a light. The organic light-emitting layer may function as a variable resistor when the light-emitting elements are operated. The organic light-emitting layer may have different configurations and different materials depending on the color of a light to be generated. Thus, the light-emitting elements may have different capacitances when operated.

The above information disclosed in this Background section is only for understanding of the background of the inventive concepts, and, therefore, it may contain information that does not constitute prior art.

SUMMARY

Applicant realized that because the light-emitting elements in an organic light-emitting layer may have different capacitances when operated, the light-emitting elements may start emitting light at different times or color bleeding may appear in images.

Organic light-emitting display devices constructed according to the principles and exemplary implementations of the invention can address one of more of above problems and therefore have improved display quality.

Additional features of the inventive concepts will be set forth in the description which follows, and in part will be apparent from the description, or may be learned by practice of the inventive concepts.

According to one aspect of the invention, an organic light-emitting display device includes: a plurality of pattern electrodes; a hole-transporting layer disposed on the plurality of pattern electrodes; a plurality of emission layers disposed on the hole-transporting layer and overlapping the plurality of pattern electrodes, respectively; a common electrode disposed on the emission layers; and a first auxiliary layer disposed between a first one of the pattern electrodes and a first one of the emission layers, wherein the first emission layer forms an interface with the hole-transporting layer or the first auxiliary layer, the interface having a hole barrier equal to or less than about 0.1 eV, wherein the hole-transporting layer and the first auxiliary layer have a hole mobility equal to or less than about $1.0 \times 10^{-3}$ $cm^2/V \cdot s$.

The hole-transporting layer and the first auxiliary layer may exclude a p-dopant.

The first emission layer may include a host and a dopant to emit a green light.

The hole-transporting layer and the first auxiliary layer may be formed from substantially the same material.

A hole-injection layer may be disposed between the plurality of pattern electrodes and the hole-transporting layer.

The first auxiliary layer may be disposed between the hole-transporting layer and the hole-injection layer.

The first auxiliary layer may be disposed between the hole-transporting layer and the first emission layer to at least partially contact the first emission layer.

An electron-transporting layer may be disposed between the common electrode and the emission layers.

An electron-injection layer may be disposed between the electron-transporting layer and the common electrode.

A second one of the emission layers may overlap a second one of the pattern electrodes and may include a host and a dopant to emit a red light, and a third one of the emission layers may overlap a third one of the pattern electrodes and may include a host and a dopant to emit a blue light.

A second auxiliary layer may be disposed between the second pattern electrode and the second emission layer and including a hole-transporting material.

The hole-transporting layer may have a thickness of about 100 Å to about 1,000 Å.

The emission layers may have a thickness of about 100 Å to about 1,000 Å.

The hole-transporting layer and the first auxiliary layer may have a hole mobility equal to or less than about $1.0 \times 10^5$ $cm^2/V \cdot s$.

The interface may have an electron barrier equal to or less than about 0.3 eV.

The electron barrier of the interface may be about 0.1 eV to about 0.2 eV.

The hole-transporting layer and the first auxiliary layer may have a hole concentration equal to or less than about $2.0 \times 10^{18}/cm^3$.

The hole concentration of the hole-transporting layer and the first auxiliary layer may be equal to or less than about $1.0 \times 10^{18}/cm^3$.

The first emission layer may have a hole mobility of greater than about $1.0 \times 10^{-7}$ $cm^2/V \cdot s$ and less than about $1.0 \times 10^{-5}$ $cm^2/V \cdot s$.

The hole mobility of the first emission layer may be about $5.0 \times 10^{-6}$ $cm^2/V \cdot s$ to about $5.0 \times 10^{-7}$ $cm^2/V \cdot s$.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
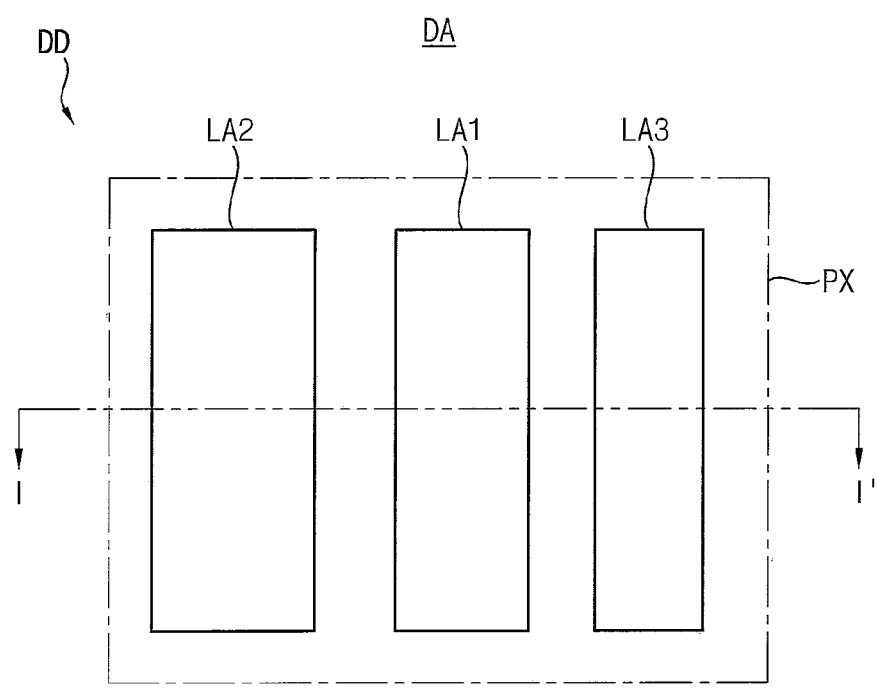
FIG. 1 is a plan view illustrating an exemplary embodiment of a display device constructed according to principles of the invention.
Figure 1:

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other is element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
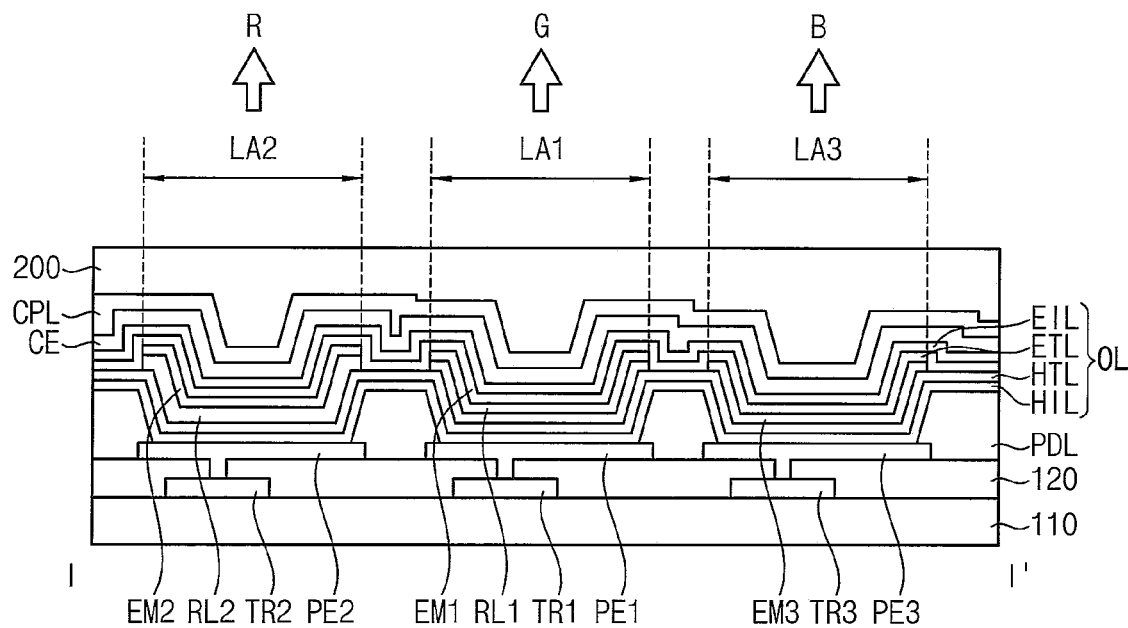
FIG. 2 is a cross-sectional view taken along the line I-I' of FIG. 1.

FIG. 1 is a plan view illustrating an exemplary embodiment of a display device constructed according to principles of the invention. FIG. 2 is a cross-sectional view taken along the line I-I' of FIG. 1.

Referring to FIGS. 1 and 2, an organic light-emitting display device DD includes a display area DA for generating an image. The display area DA includes light-emitting areas emitting lights having different colors from each other. For example, the organic light-emitting display device DD may include a first light-emitting area LA1 emitting a first color light, a second light-emitting area LA2 emitting a second color light and a third light-emitting area LA3 emitting a third color light. In some exemplary embodiments, the first light-emitting area LA1 may emit a green light, the second light-emitting area LA2 may emit a red light, and the third light-emitting area LA3 may emit a blue light.

In some exemplary embodiments, the light-emitting areas LA1, LA2 and LA3 may have a substantially rectangular shape extending in a first direction D1, respectively, and may be arranged in a second direction D2 intersecting the first direction D1. However, exemplary embodiments are not limited thereto. For example, the light-emitting areas LA1, LA2 and LA3 may have different shapes from each other. Furthermore, the light-emitting areas LA1, LA2 and LA3 may have various shapes such as a generally square shape, a generally rectangular shape, a generally triangular shape, a generally hexagonal shape, a generally circular shape or the like. An edge or a corner of the light-emitting areas LA1, LA2 and LA3 may have a generally round shape or may be generally chamfered. Furthermore, the light-emitting areas LA1, LA2 and LA3 may be combined with each other to form a quincunx typically including two red subpixels, two green subpixels, and one central blue subpixel in each unit cell, such as the matrix sold under the trade designation PenTile matrix by Samsung Display Co., LTD of Seoul, South Korea.

In some exemplary embodiments, the light-emitting areas LA1, LA2 and LA3 may have different sizes from each other. However, exemplary embodiments are not limited thereto. For example, the light-emitting areas LA1, LA2 and LA3 may have substantially the same size.

The organic light-emitting display device DD includes a light-emitting element and a driving element electrically connected to the light-emitting element. The light-emitting element may generate a light to in response to an electric signal or a power applied thereto. The light generated by the light-emitting element may exit through a corresponding light-emitting area. In some exemplary embodiments, the light-emitting element may be an organic light-emitting diode.

The driving element and the light-emitting element may be disposed on a base substrate 110. For example, the driving element may include a first driving element TR1, a second driving element TR2 and a third driving element TR3. The driving elements TR1, TR2 and TR3 may have configurations known in the art.

The driving elements TR1, TR2 and TR3 may be covered by an insulation structure 120. The insulation structure 120 may include an inorganic insulation layer, an organic insulation layer or a combination thereof.

For example, the base substrate 110 may include a glass, a quartz, a sapphire, a polymeric material or the like. In some exemplary embodiments, each of the driving elements TR1, TR2 and TR3 may include at least one thin film transistor. For example, each of the driving elements TR1, TR2 and TR3 may include a plurality of thin film transistors.

For example, a channel layer of the thin film transistor may include an amorphous silicon, a multi-crystalline silicon, such as a polysilicon, and/or a metal oxide. For example, the metal oxide may include two-component compound ($AB_x$), ternary compound ($AB_xC_y$) or four-component compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). For example, the metal oxide may include a zinc oxide ($ZnO_x$), a gallium oxide ($GaO_x$), a titanium oxide ($TiO_x$), a tin oxide ($SnO_x$), an indium oxide ($InO_x$), an indium-gallium oxide (IGO), an indium-zinc oxide (IZO), an indium tin oxide (ITO), a gallium zinc oxide (GZO), a zinc magnesium oxide (ZMO), a zinc tin oxide (ZTO), a zinc zirconium oxide ($ZnZr_xO_y$), an indium-gallium-zinc oxide (IGZO), an indium-zinc-tin oxide (IZTO), an indium-gallium-hafnium oxide (IGHO), a tin-aluminum-zinc oxide (TAZO), an indium-gallium-tin oxide (IGTO) or the like.

The insulation structure 120 may include an inorganic insulation layer, an organic insulation layer or a combination thereof. For example, the inorganic insulation layer may include a silicon oxide, a silicon nitride, a silicon oxynitride or a combination thereof. Furthermore, the inorganic insulation layer may include an insulating metal oxide such as an aluminum oxide, a tantalum oxide, a hafnium oxide, a zirconium oxide, a titanium oxide or the like. For example, the organic insulation layer may include a phenolic resin, an acrylic resin, a polyimide resin, a polyamide resin, a siloxane resin, an epoxy resin or a combination thereof.

The driving elements TR1, TR2 and TR3 may be electrically connected to a corresponding light-emitting element. For example, the light-emitting element includes an anode, an organic light-emitting structure and a cathode. The light-emitting element generates a light based on operation of the driving elements TR1, TR2 and TR3.

In an exemplary embodiment, the light-emitting element includes a pattern electrode electrically connected to a corresponding driving element. For example, the pattern electrode may function as an anode of an organic light-emitting diode. The pattern electrode may be referred as to a lower electrode or a first electrode.

For example, the organic light-emitting display device may include a first pattern electrode PE1 electrically connected to a first driving element TR1, a second pattern electrode PE2 electrically connected to a second driving element TR2 and a third pattern electrode PE3 electrically connected to a third driving element TR3.

For example, the plurality of pattern electrodes PE1, PE2 and PE3 may have a multi-layered structure including a metal oxide layer and a metal layer. The metal oxide layer may include an indium tin oxide, an indium zinc oxide, a zinc tin oxide, an indium oxide, a zinc oxide, a tin oxide or a combination thereof. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof.

An organic light-emitting structure OL may be disposed on the pattern electrodes PE1, PE2 and PE3. A common electrode CE may be disposed on the organic light-emitting structure OL. The common electrode CE may function as a cathode. The common electrode CE may be referred as to an upper electrode or a second electrode.

For example, the common electrode CE may include a metal, a metal alloy, a metal nitride, a metal fluoride, a conductive metal oxide or a combination thereof. For example, the common electrode CE may include lithium (Li), calcium (Ca), silver (Ag), aluminum (Al), magnesium (Mg), an indium tin oxide, an indium zinc oxide, a zinc tin oxide, an indium oxide, a zinc oxide, a tin oxide or a combination thereof.

A pixel-defining layer PDL may be disposed on the insulation structure 120. The pixel-defining layer PDL includes openings overlapping the pattern electrodes PE1, PE2 and PE3, respectively. The openings may define the shape and the size of the light-emitting areas LA1, LA2 and LA3.

For example, the pixel-defining layer PDL may include an organic insulation material such as a phenolic resin, an acrylic resin, a polyimide resin, a polyamide resin, a siloxane resin, an epoxy resin or a combination thereof.

In some exemplary embodiments, a capping layer CPL may be disposed on the common electrode CE, and an encapsulation layer 200 may be disposed on the capping layer CPL.

For example, the capping layer CPL may include an inorganic material, an organic material or a combination thereof. For example, the inorganic material may include a zinc oxide, a tantalum oxide, a zirconium oxide, a titanium oxide or the like. For example, the organic material may include poly(3,4-ethylenedioxythiophene), PEDOT), 4,4'-bis[N-(3-methylphenyl)-N-phenylamino]biphenyl(TPD), 4,4',4''-tris[(3-methylphenyl)phenylamino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB) or the like. For example, the capping layer CPL may have a refractive index equal to or more than about 1.6 (at 589 nm).

For example, the encapsulation layer 200 may have a stacked structure of an inorganic thin film and an organic thin film. For example, the encapsulation layer 200 may include a pair of inorganic thin films and an organic thin film disposed therebetween. However, exemplary embodiments are not limited thereto. For example, the encapsulation layer 200 may include at least two organic thin films and at least three inorganic thin films.

For example, the organic thin film may include a cured resin such as a polyacrylate, an epoxy resin, a silicone resin or the like. For example, the cured resin may be formed from cross-linking reaction of monomers. For example, the inorganic thin films may include an inorganic material such as a silicon oxide, a silicon nitride, a silicon oxynitride, a silicon carbide, an aluminum oxide, a tantalum oxide, a hafnium oxide, a zirconium oxide, a titanium oxide or a combination thereof.

In some exemplary embodiments, the organic light-emitting structure OL may include a hole-transporting region, an emission region and an electron-transporting region. For example, the organic light-emitting structure OL may include a hole-injection layer HIL, a hole-transporting layer HTL, an auxiliary layer RM1 and RM2, an emission layer EM1, EM2 and EM3, an electron-transporting layer ETL and an electron-injection layer EIL. The hole-transporting region may include the hole-injection layer HIL, the hole-transporting layer HTL and the auxiliary layer RM1 and RM2. The electron-transporting region may include the electron-transporting layer ETL and the electron-injection layer EIL. In some exemplary embodiments, the emission layer may include a first emission layer EL1 configured to generate a green light, a second emission layer EL2 configured to generate a red light, and a third emission layer EL3 configured to generate a blue light.

In some exemplary embodiments, the hole-injection layer HIL, the hole-transporting layer HTL, the electron-transporting layer ETL and the electron-injection layer EIL may be disposed as a common layer continuously extending in the organic light-emitting structure OL. The first to third emission layers EM1, EM2 and EM3 may be disposed selectively in a corresponding light-emitting area to have a separated pattern shape.

In some exemplary embodiments, the auxiliary layer may include a first auxiliary layer RL1 overlapping the first light-emitting area LA1, and a second auxiliary layer RL2 overlapping the second light-emitting area LA2. The auxiliary layer may be added to match the thickness of the organic light-emitting structure OL with a resonance thickness of a light generated in the organic light-emitting structure OL. Thus, the first auxiliary layer RL1 and the second auxiliary layer RL2 may have different thicknesses.

For example, the first auxiliary layer RL1 may be disposed between the first emission layer EM1 and the hole-transporting layer HTL. The second auxiliary layer RL2 may be disposed between the second emission layer EM2 and the hole-transporting layer HTL. However, exemplary embodiments are not limited thereto. For example, at least one of the first auxiliary layer RL1 and the second auxiliary layer RL2 may be disposed between the hole-transporting layer HTL and the hole-injection layer HIL or between the hole-injection layer HIL and a corresponding pattern electrode.

In some exemplary embodiments, the first auxiliary layer RL1 and the second auxiliary layer RL2 may include substantially the same material as the hole-transporting layer HTL. However, exemplary embodiments are not limited thereto. For example, the first auxiliary layer RL1 and the second auxiliary layer RL2 may include a different material from the hole-transporting layer HTL, or may include different materials from each other. In another exemplary embodiment, the auxiliary layer may further include a third auxiliary layer overlapping the third light-emitting area LA3.

For example, the hole-injection layer HIL and the hole-transporting layer HTL may include a hole-transporting material. For example, the hole-injection layer HIL and the hole-transporting layer HTL may include may include at least one of 4,4',4''-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4''-tris[2-naphthyl(phenyl)amino]triphenylamine (2-TNATA), N4,N4'-di(naphthalen-2-yl)-N4,N4'-diphenyl-[1,1'-biphenyl]-4,4'-diamine (NPB or NPD), N4,N4'-di(naphthalen-2-yl)-N4,N4'-diphenyl-[1,1'-biphenyl]-4,4'-diamine (P—NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N, N,N'-di(1-naphthyl)-N,N'-2,2'dimethyldiphenyl-(1,1'-biphenyl)-4,4'-diamine (methylated-NPB), 4,4'-cyclohexylidenebis[N,N-bis(4- methylphenyl)benzenamine](TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201A, a compound represented by Formula 201B, a compound represented by Formula 202A and a compound represented by Formula 202B.

$C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic fused polycyclic group, and a substituted or unsubstituted divalent non-aromatic fused heteropolycyclic group.

xa3 may be an integer from 0 to 3, and xa5 may be an integer from 1 to 10.

$R_{202}$, $R_{203}$, $R_{204}$, $R_{211}$ and $R_{212}$ may each independently be selected from a substituted or unsubstituted $C_3$-$C_{10}$ cycloalkyl group, a substituted or unsubstituted $C_1$-$C_{10}$

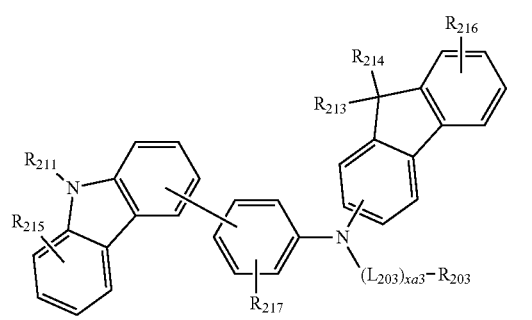

Formula 201A

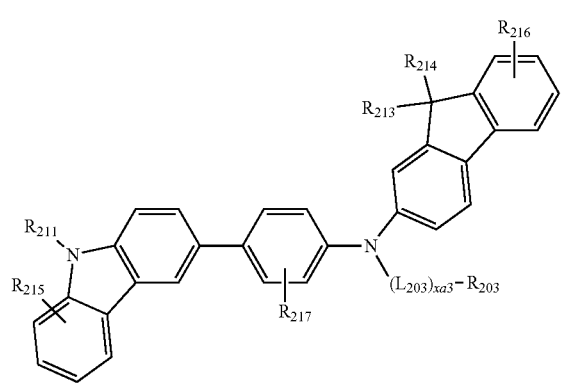

Formula 201B

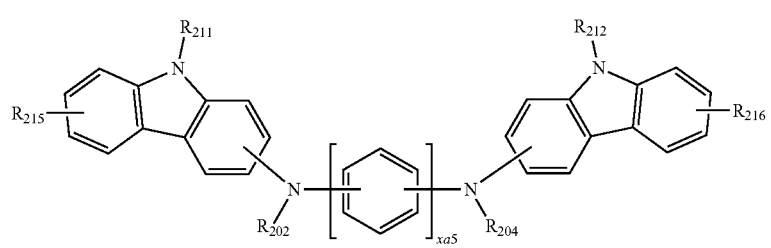

Formula 202A

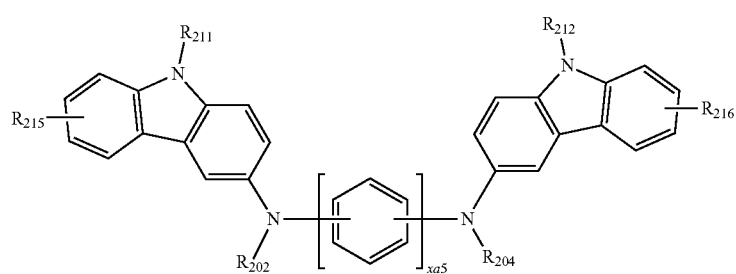

Formula 202B

In Formulae 201A, 201B, 202A and 202B, $L_{203}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group.

$R_{213}$, $R_{214}$, $R_{215}$, $R_{216}$ and $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole-injection layer HIL and the hole-transporting layer HTL may include at least one of the following Compounds HT1 to HT39.

HT1

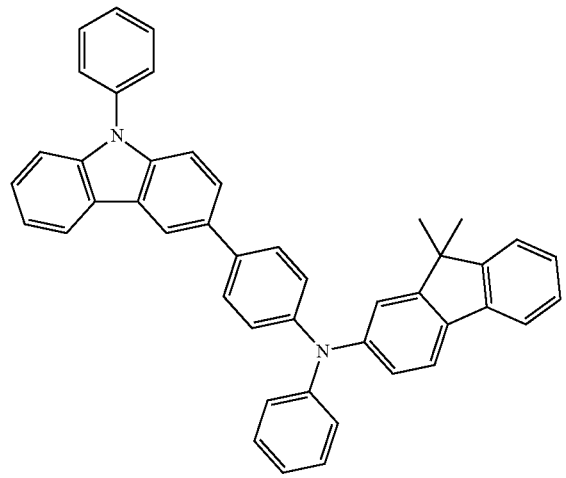

HT2

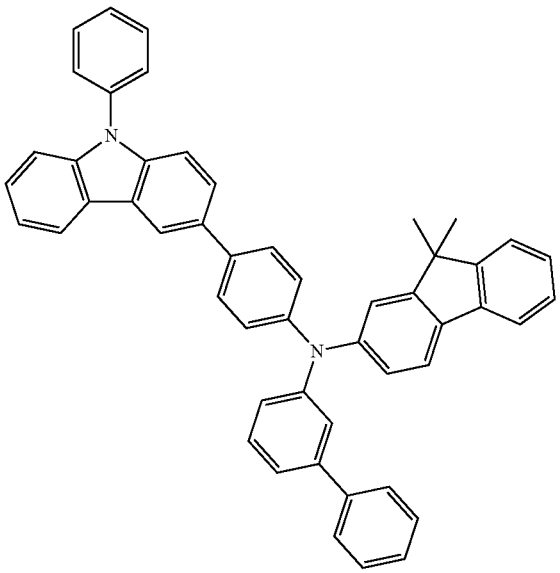

HT3

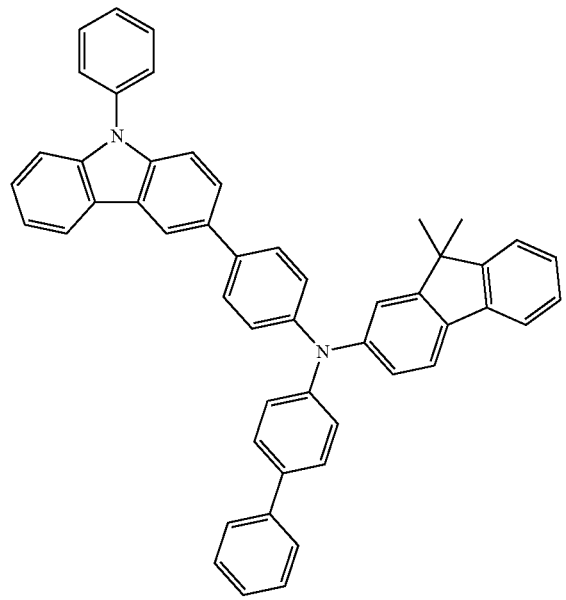

HT4

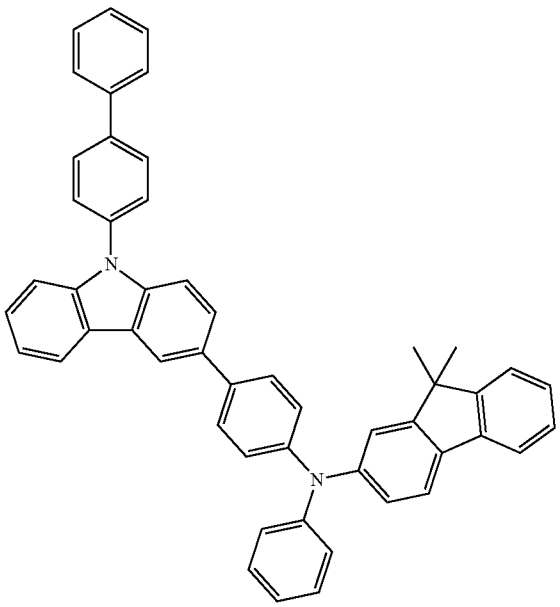

-continued
HT5
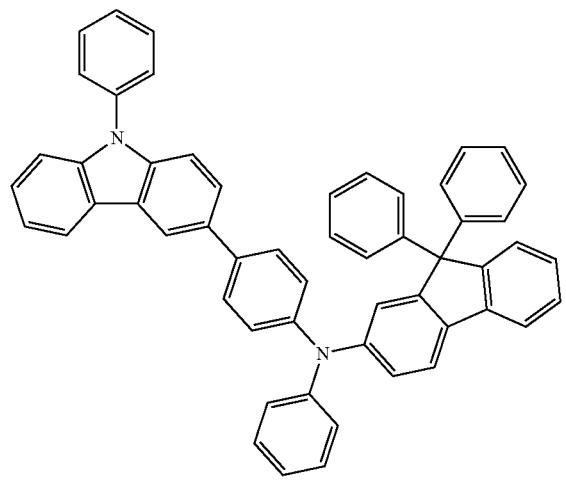
HT6
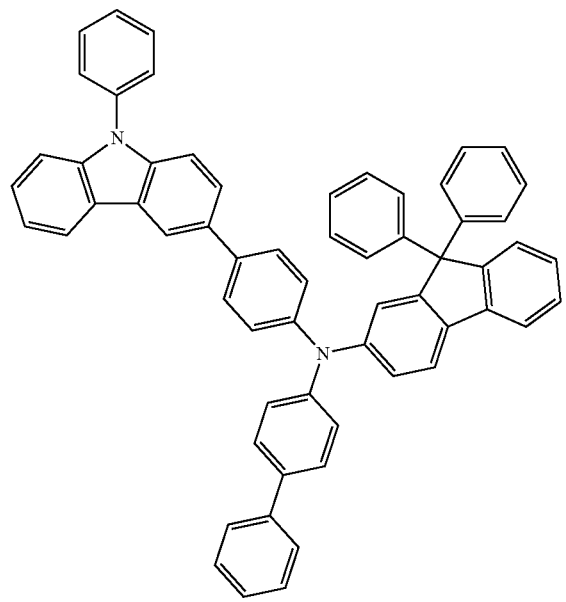
HT7
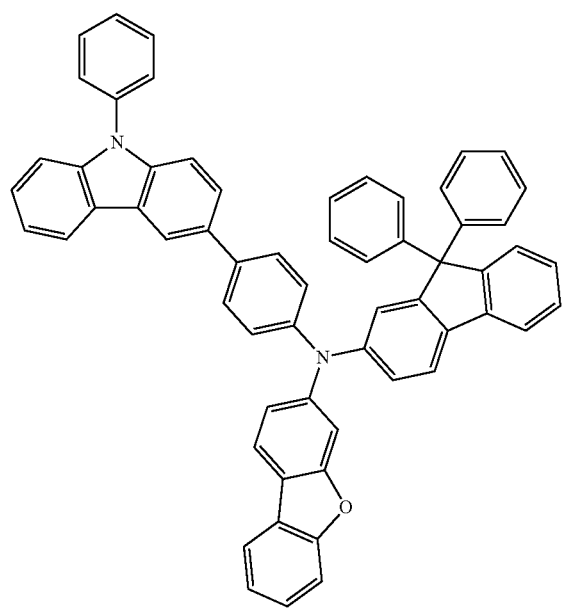
HT8
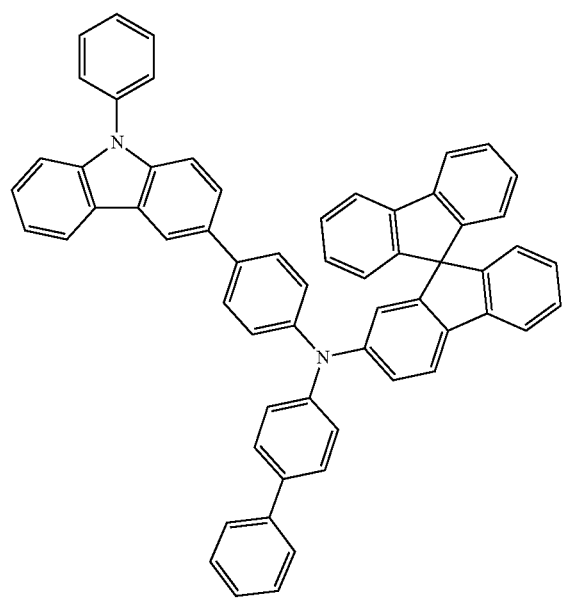

-continued
HT9
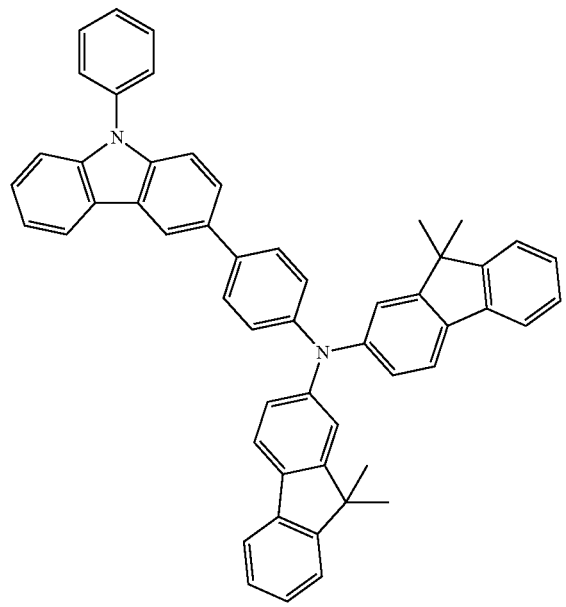
HT10
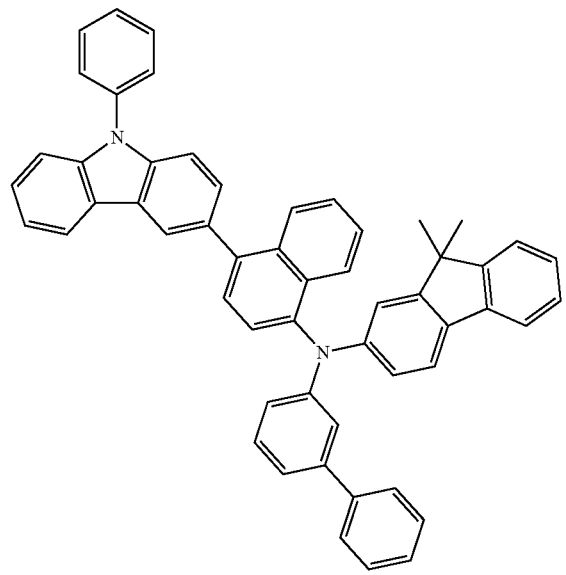
HT11
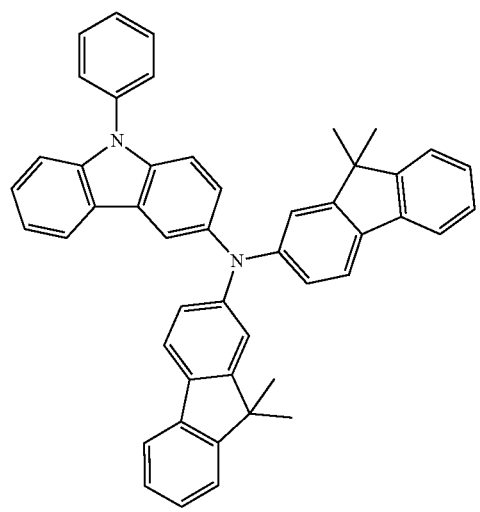
HT12
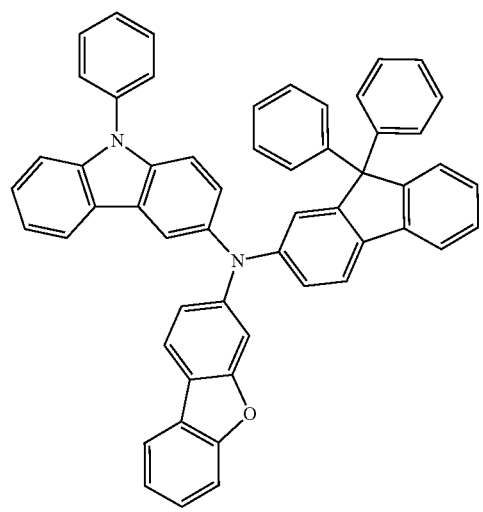

-continued
HT13
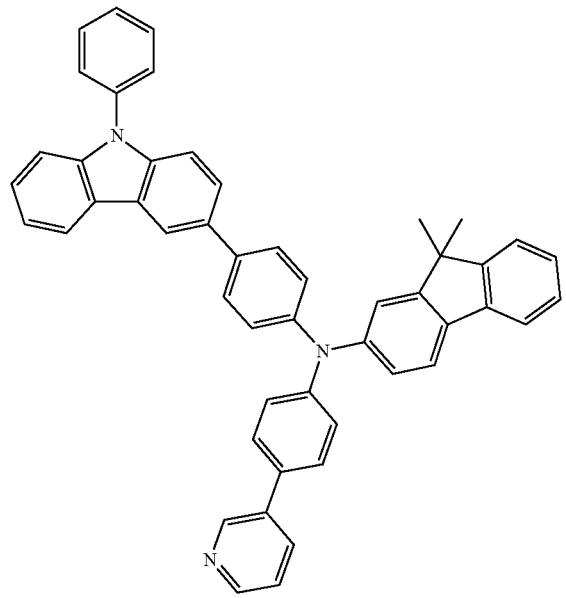
HT14
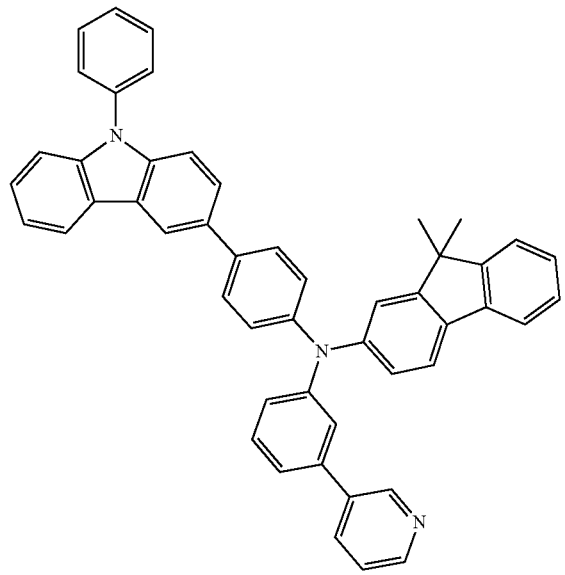
HT15
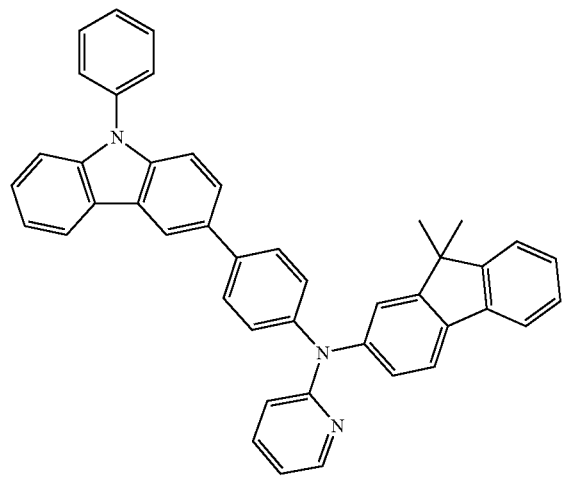
HT16
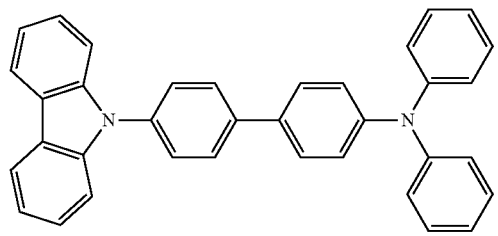
HT17
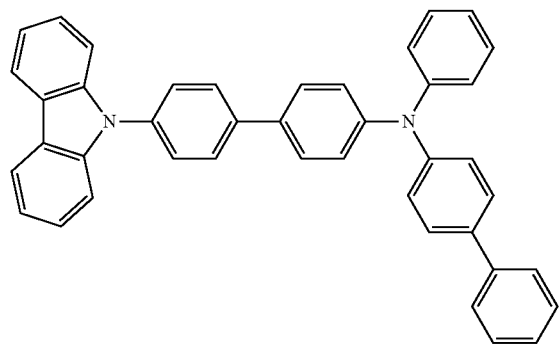
HT18
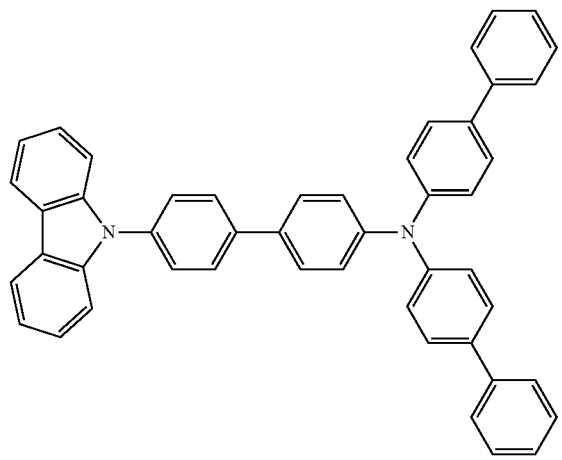

-continued
HT19
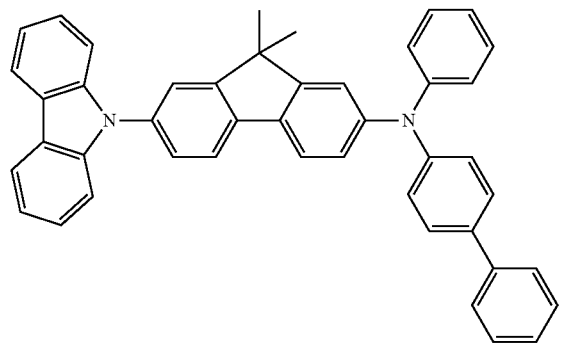
HT20
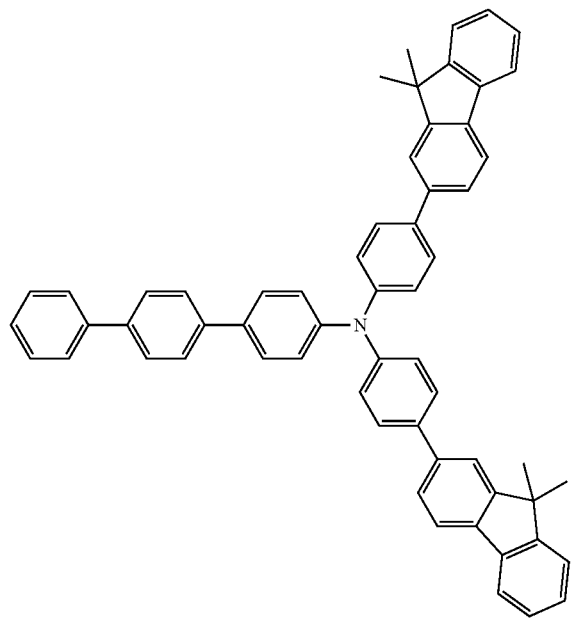
HT21
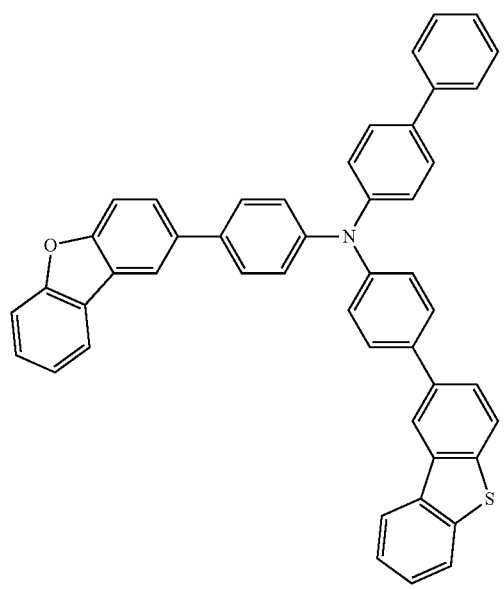
HT22
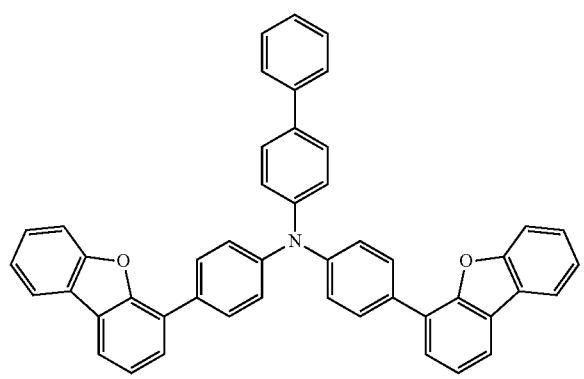

-continued
HT23
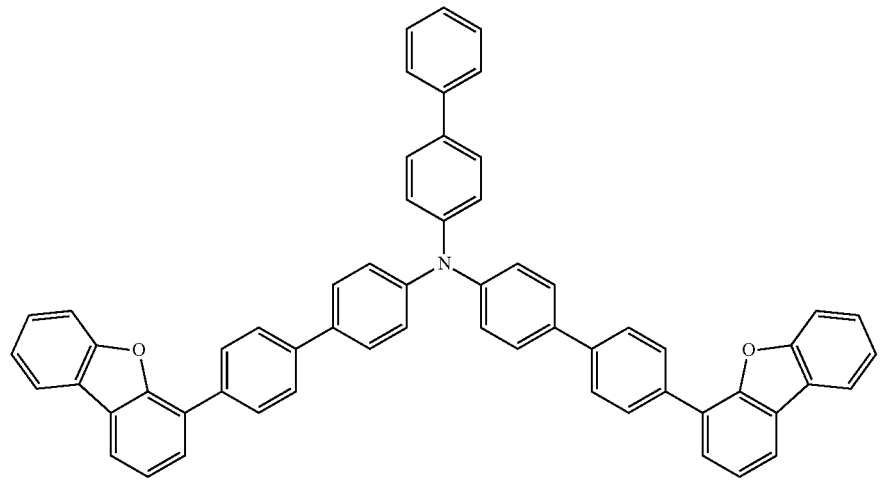
HT24
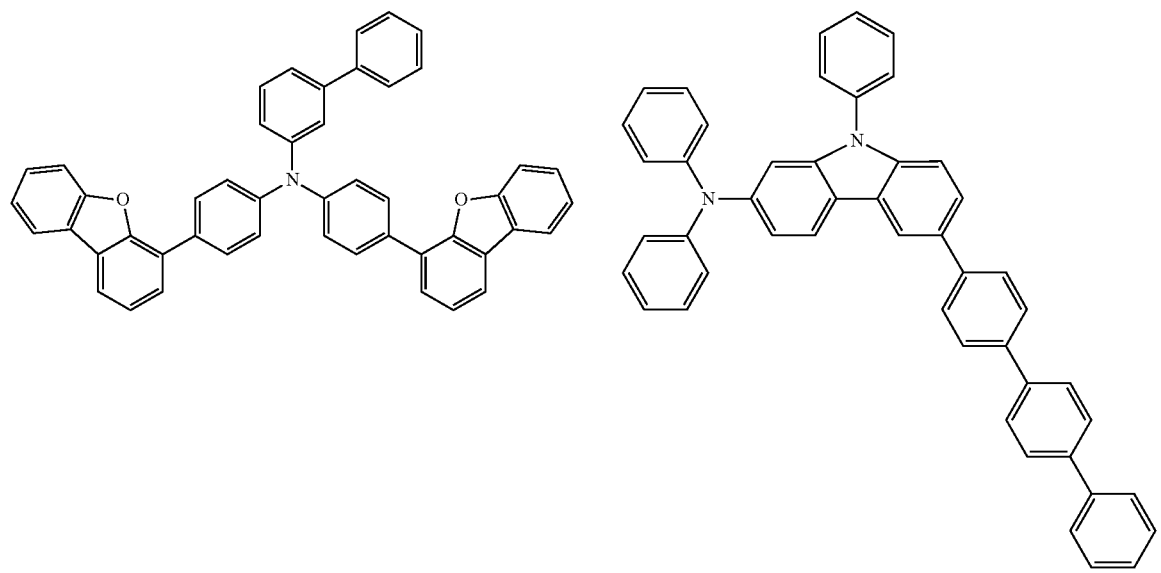
HT25
HT26
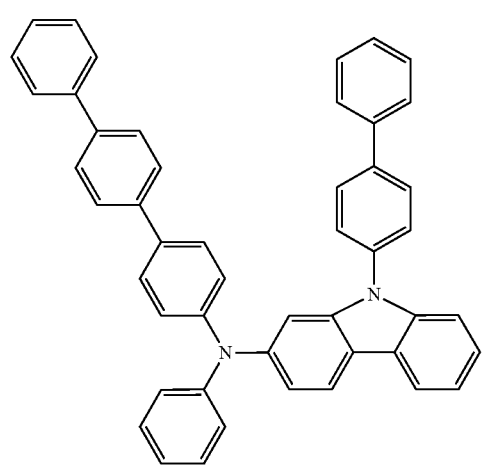
HT27
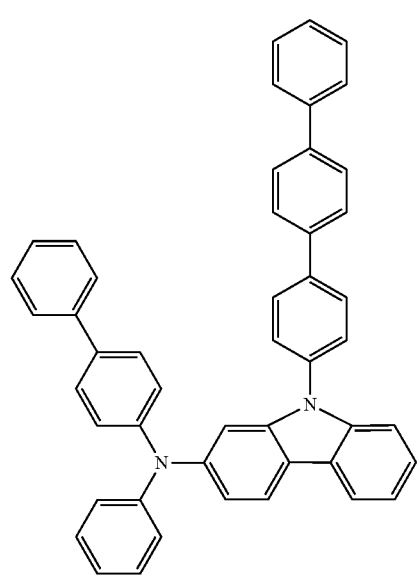

-continued
HT28
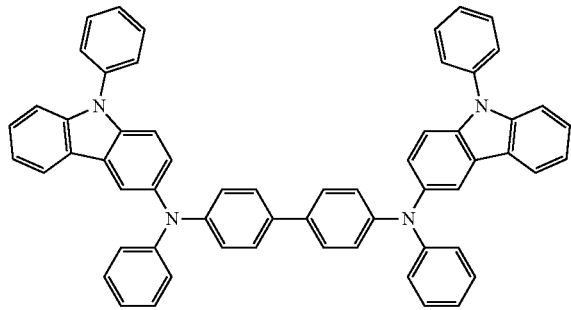
HT29
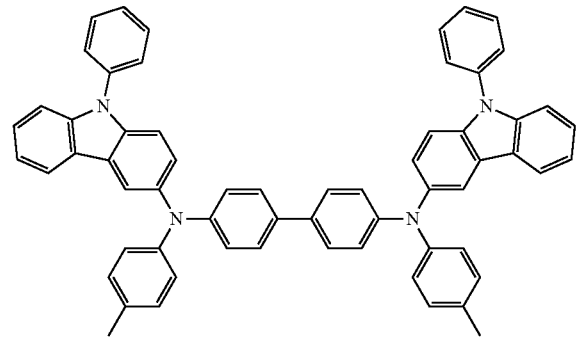
HT30
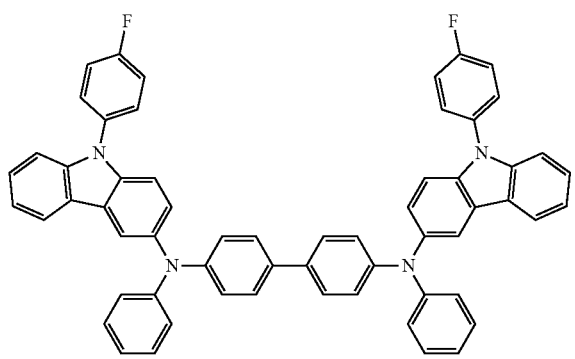
HT31
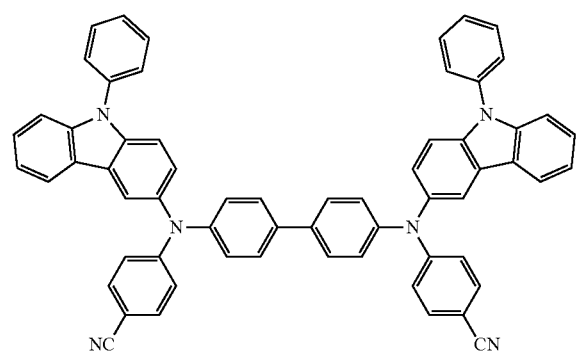
HT32
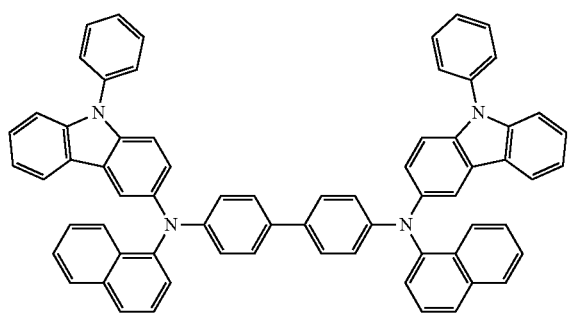
HT33
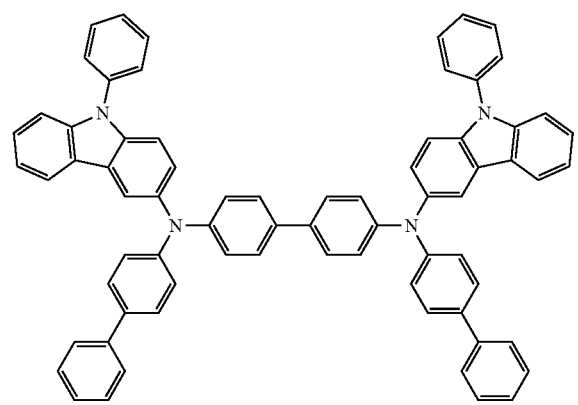

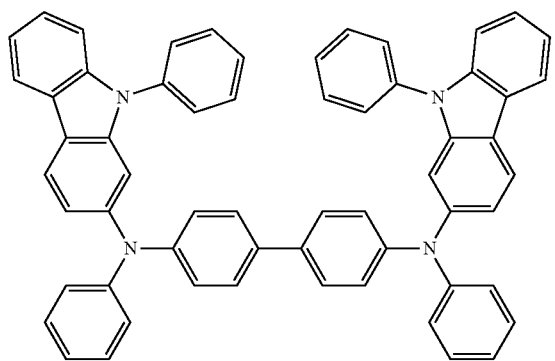
HT34
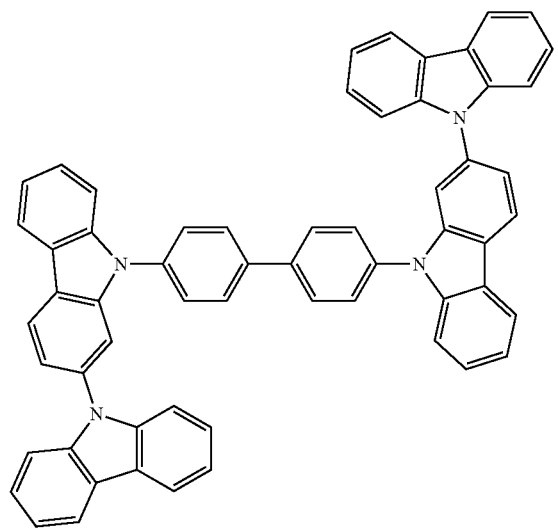
HT35
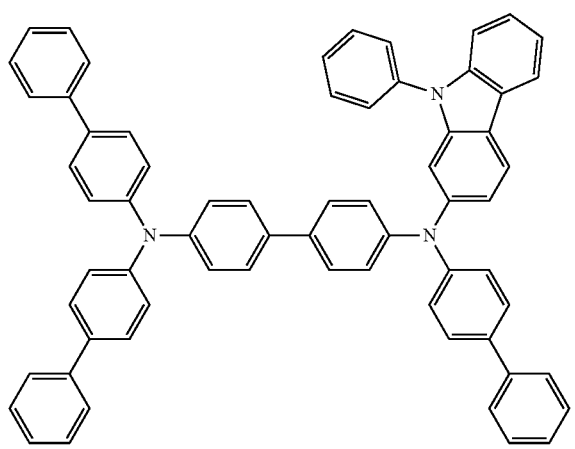
HT36
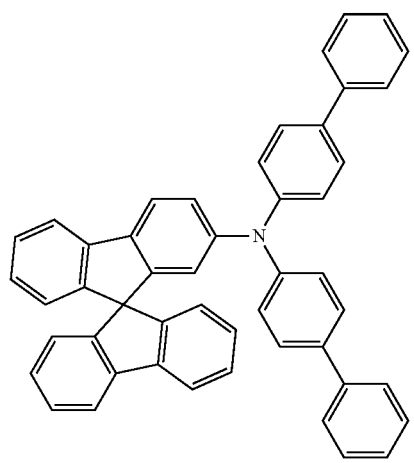
HT37
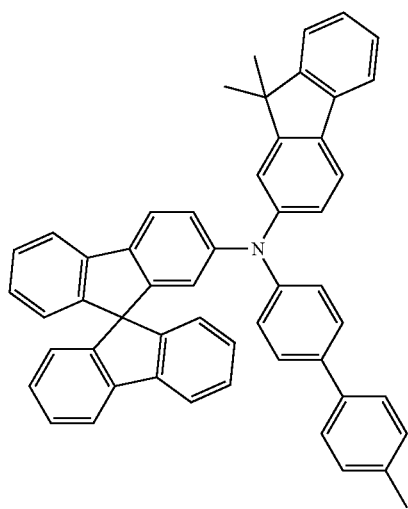
HT38
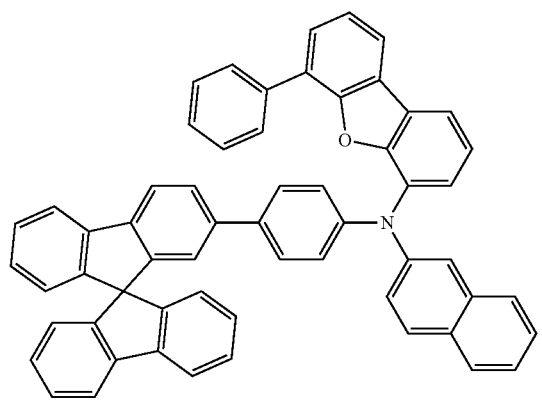
HT39
At least one of the hole-injection layer HIL and the hole-transporting layer HTL may include a p-dopant, or a single layer including a p-dopant.
For example, the p-dopant may include at least one of a quinone derivative (such as tetracyanoquinodimethane (TCNQ) and/or 2,3,5,6-tetrafluoro-7,7,8,8-tetracyanoquinodimethane (F4-TCNQ)); a metal oxide (such as a tungsten oxide and/or a molybdenum oxide); 1,4,5,8,9,12-hexaazatriphenylene-hexacarbonitrile (HAT-CN); and a compound represented by Formula 221.

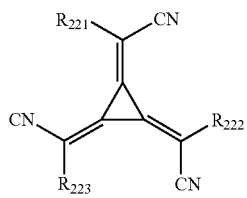

Formula 221

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group. At least one of $R_{221}$ to $R_{223}$ may include at least one substituent of a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br and a $C_1$-$C_{20}$ alkyl group substituted with —I.

In some exemplary embodiments, the hole-injection layer may include the p-dopant, and the hole-transporting layer HTL and the auxiliary layer may not include the p-dopant. For example, the thickness of the hole-transporting layer HTL may be about 100 Å to about 1,000 Å. The thickness of the auxiliary layers RL1 and RL2 may be properly selected depending on a resonance thickness of a corresponding emitted light.

The emission layers EM1, EM2 and EM3 may include a host and a dopant. The dopant may include at least one of a phosphorescent dopant and a fluorescent dopant. The dopant may be to emit at least one of a first color light to a third color light. For example, the first color light to the third color light may be a green light, a red light, and a blue light, respectively. An amount of the dopant may be about 0.01 part to about 15 parts by weight based on 100 parts by weight of the host.

For example, the host may include a compound represented by Formula 301.

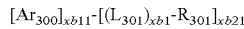

Formula 301

In Formula 301, $Ar_3O_1$ may be a substituted or unsubstituted $C_5$-$C_{60}$ carbocyclic group or a substituted or unsubstituted $C_1$-$C_{60}$ heterocyclic group.

xb11 may be 1, 2, or 3, xb1 may be an integer from 0 to 5, and xb21 may be an integer from 1 to 5.

$L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic fused polycyclic group, or a substituted or unsubstituted divalent non-aromatic fused heteropolycyclic group.

$R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, a substituted or unsubstituted monovalent non-aromatic fused heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$). $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, or a naphthyl group.

In another exemplary embodiment, the host may include an alkaline earth metal complex. For example, the host may include at least one of a Be complex, an Mg complex and a Zn complex.

For example, the host may include at least one of 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and the following Compounds H1 to H55.

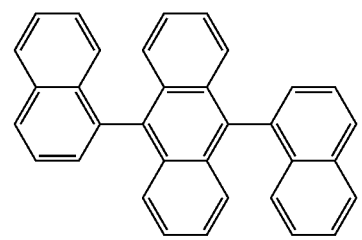

H1

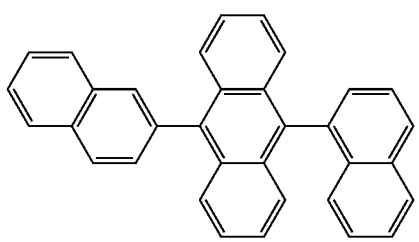

H2

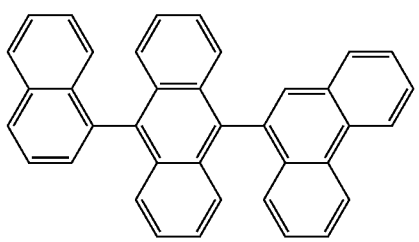

H3

-continued
H4
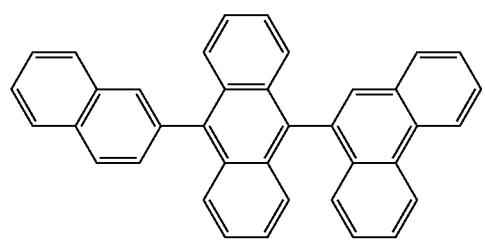
H5
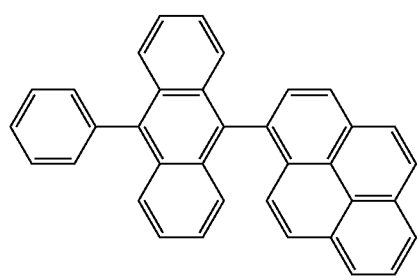
H6
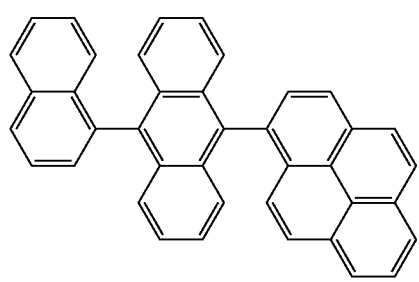
H7
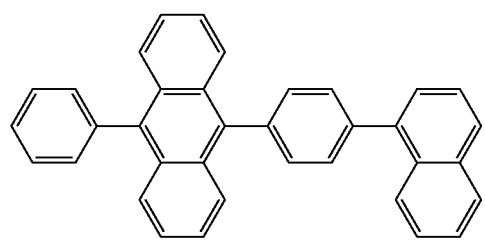
H8
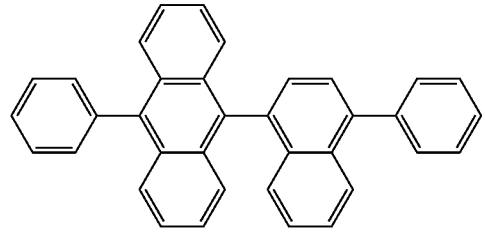
H9
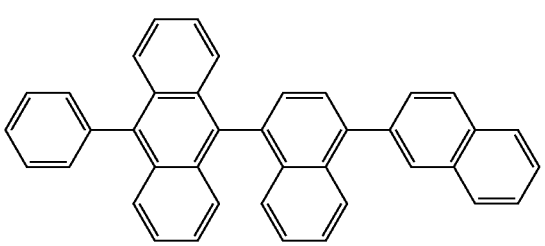
-continued
H10
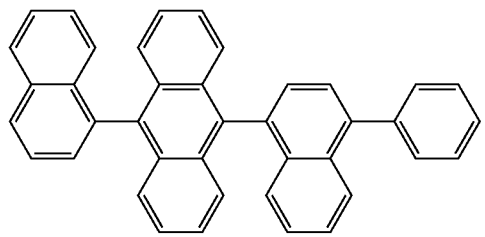
H11
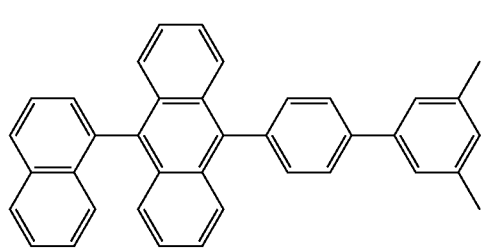
H12
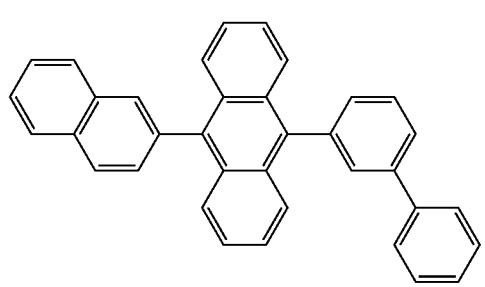
H13
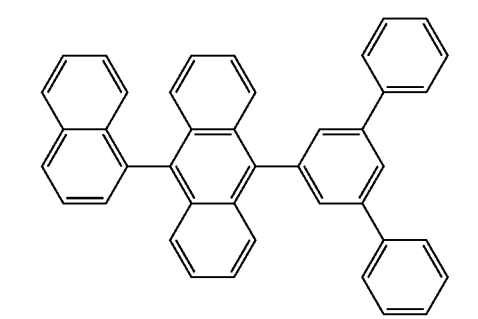
H14
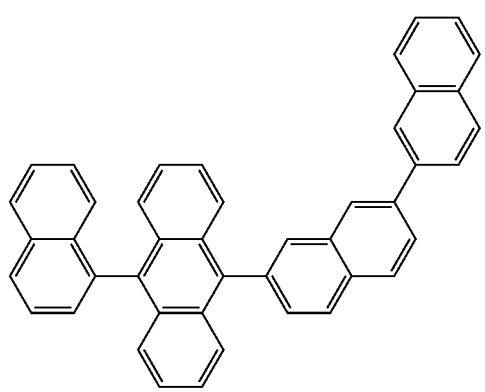

H15
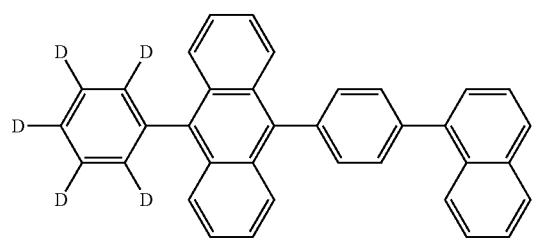
H16
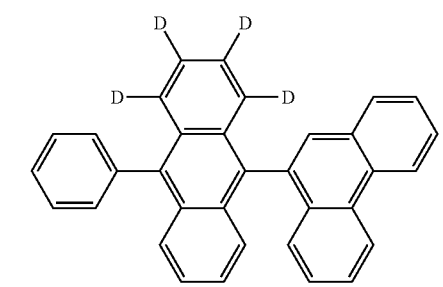
H17
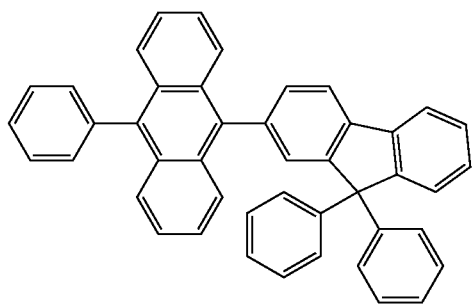
H18
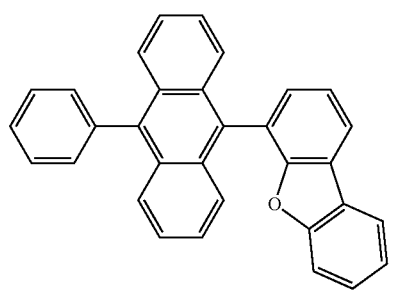
H19
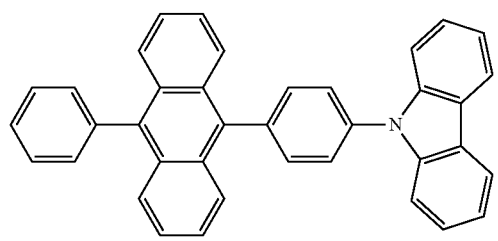
H20
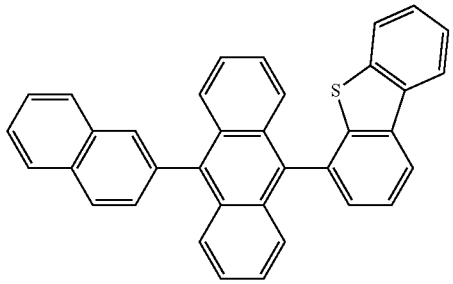
H21
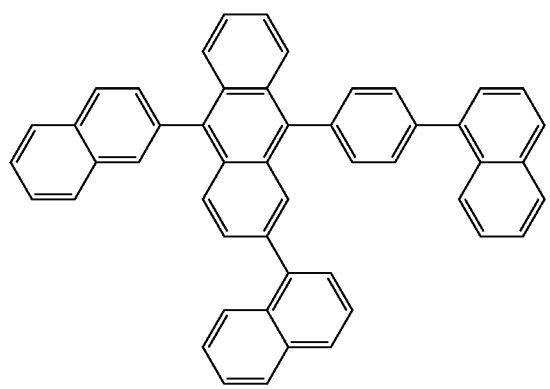
H22
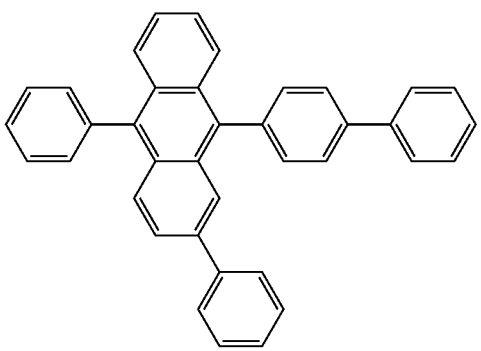
H23
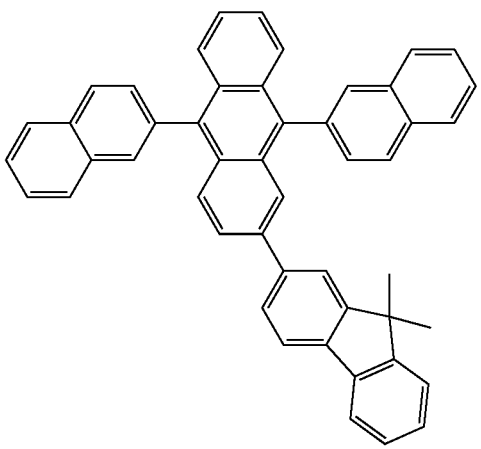

H24
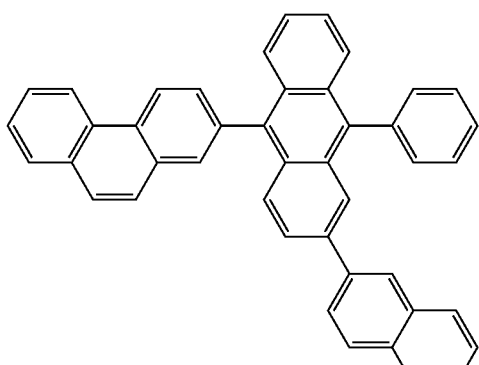
H25
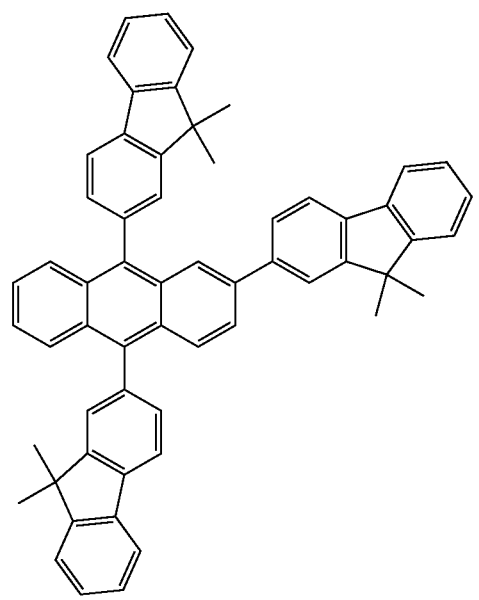
H26
H27
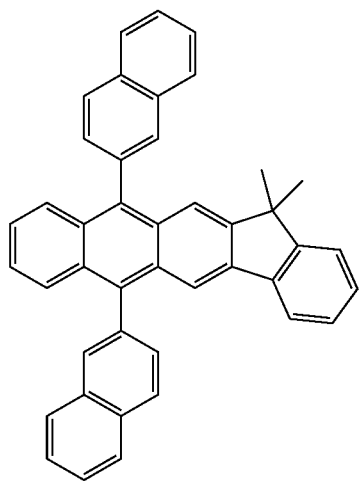
H28
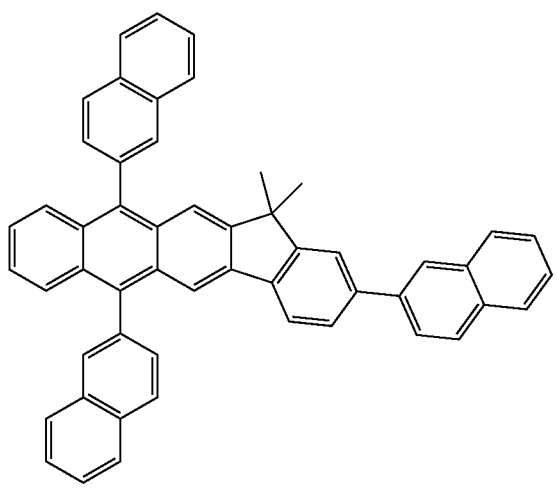
H29
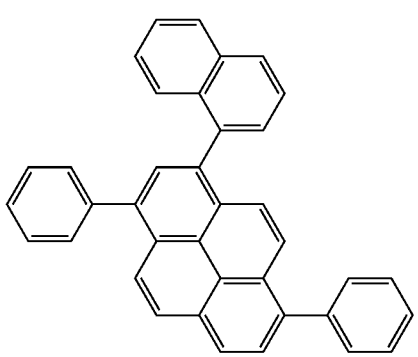

-continued
H30 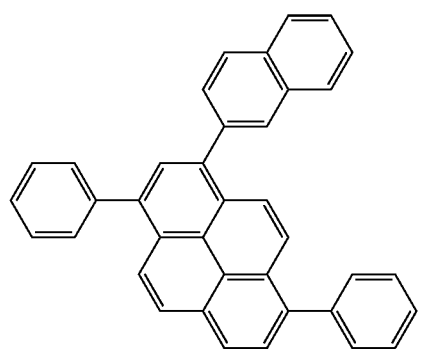
H31 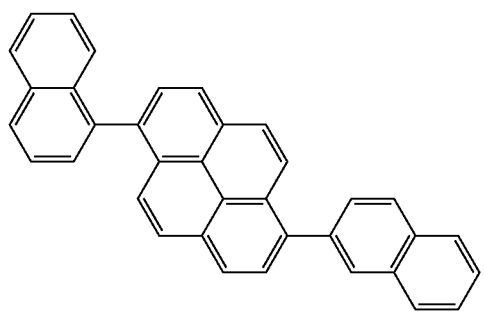
H32 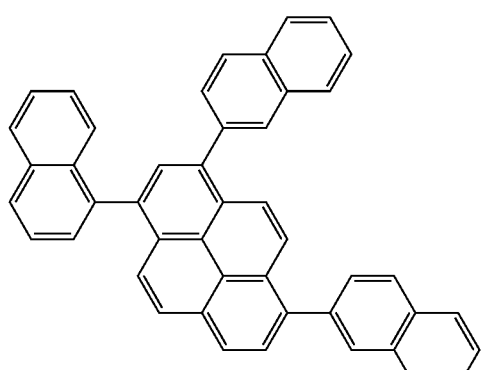
H33 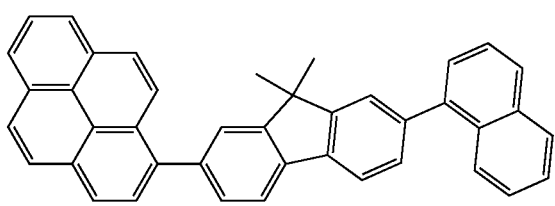
H34 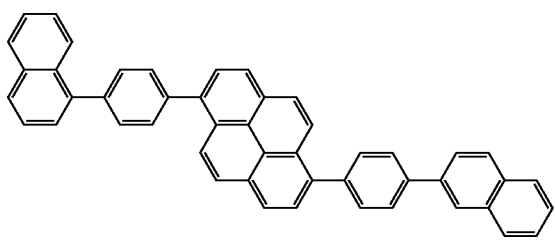
-continued
H35 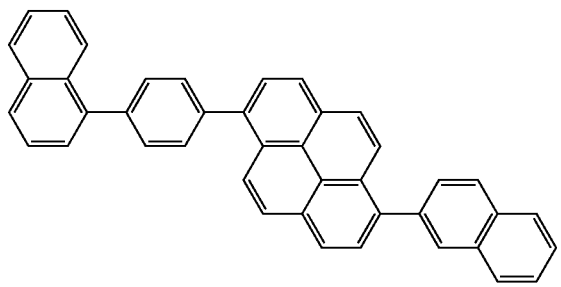
H36 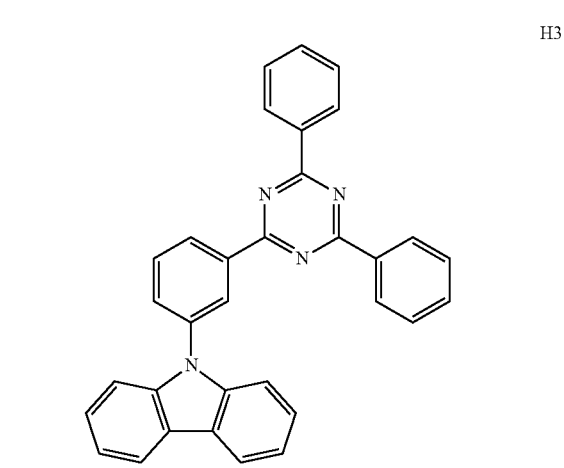
H37 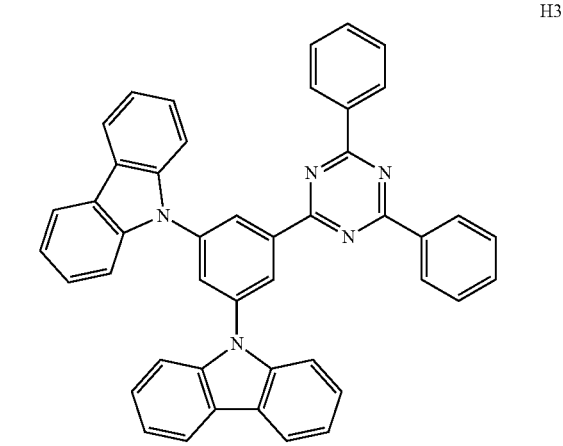
H38 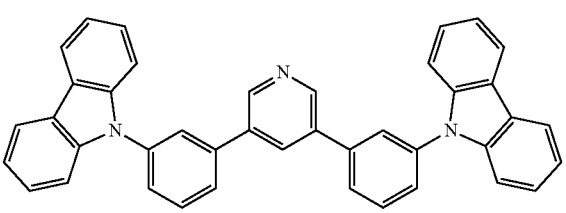

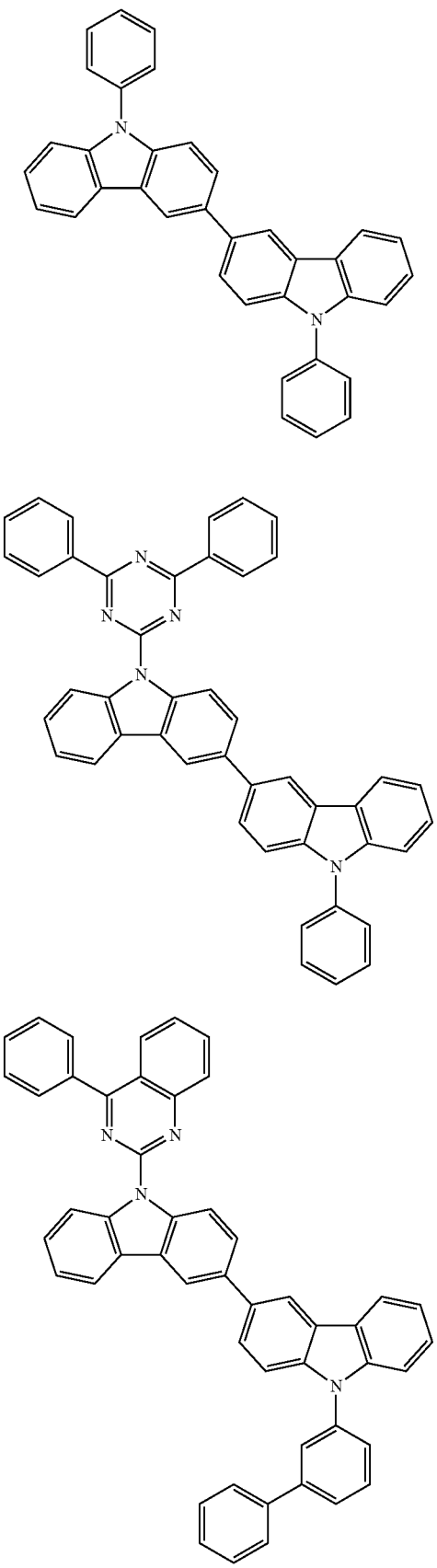
H39
H40
H41
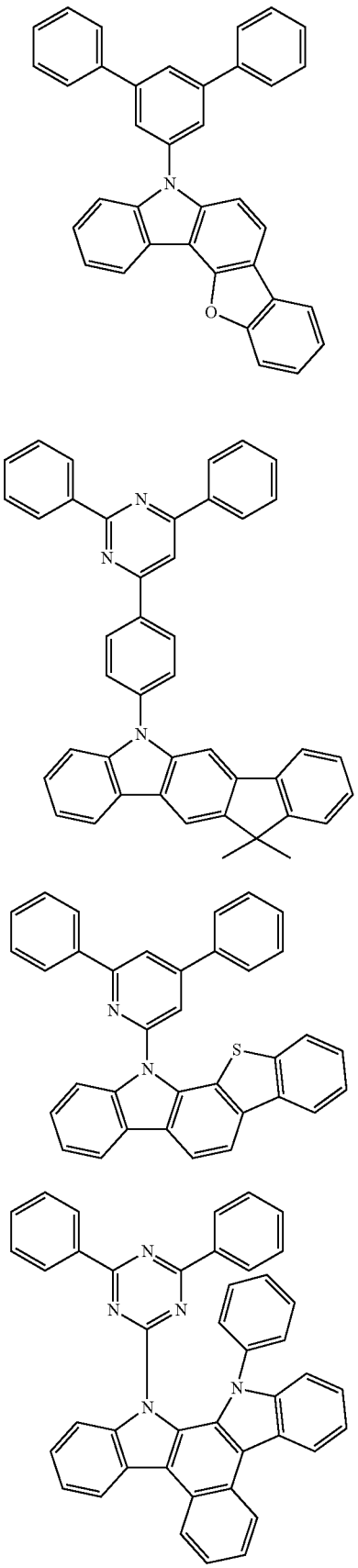
H42
H43
H44
H45

H46 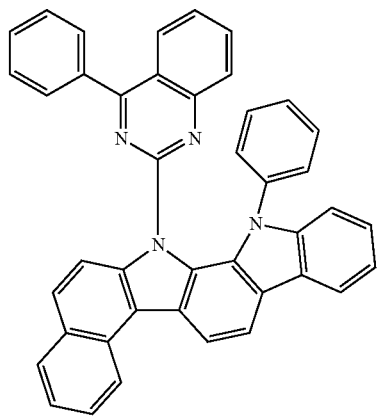
H47 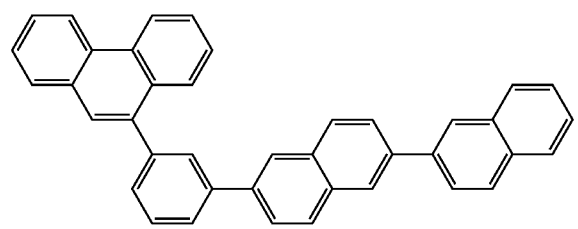
H48 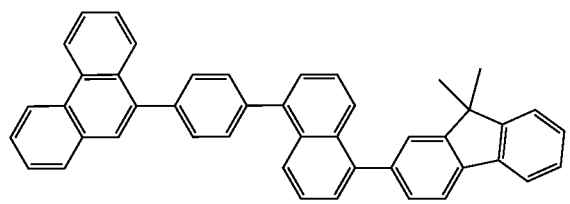
H49 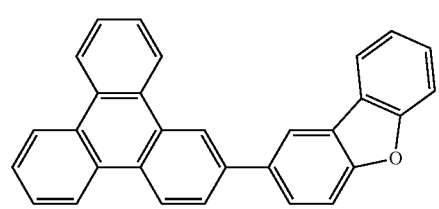
H50 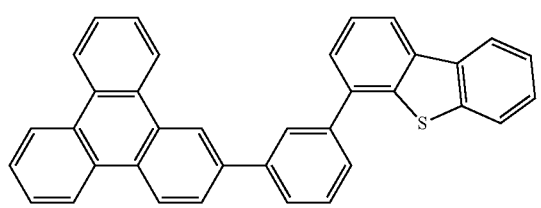
H51 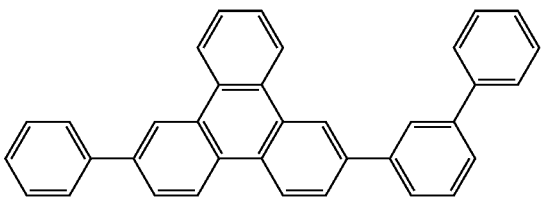
H52 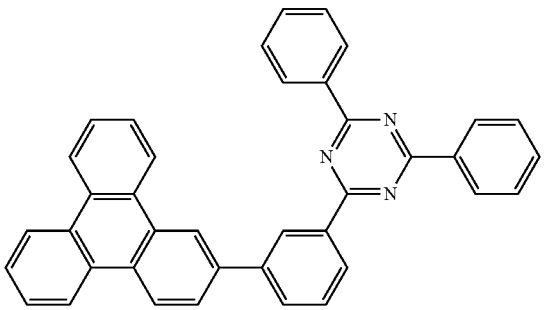
H53 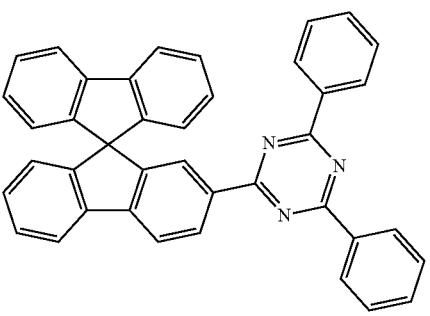
H54 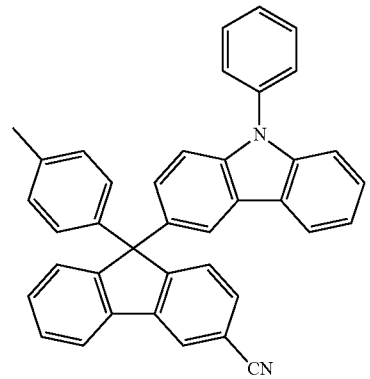
H55 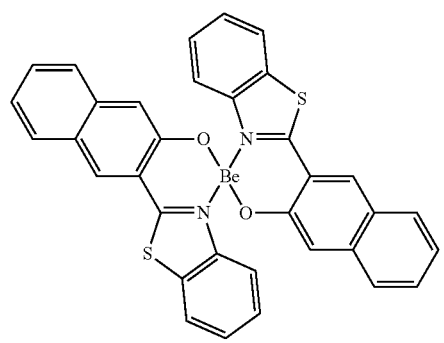
The phosphorescent dopant may include an organometallic complex.

For example, the phosphorescent dopant may include at least one of the following Compounds PD1 to PD25.
PD1
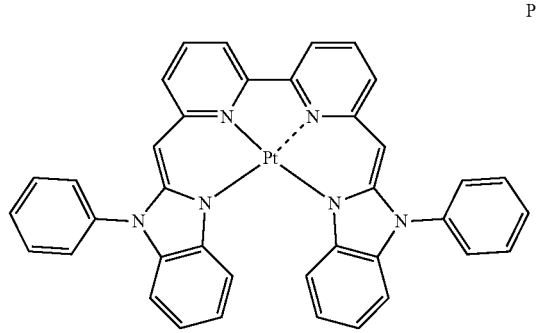
PD2
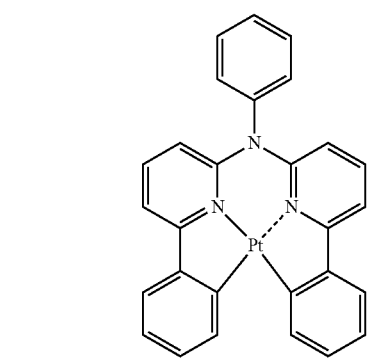
PD3
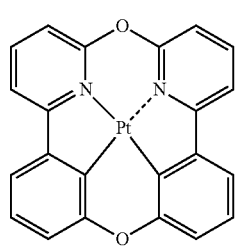
PD4
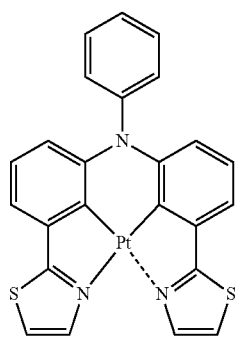
PD5
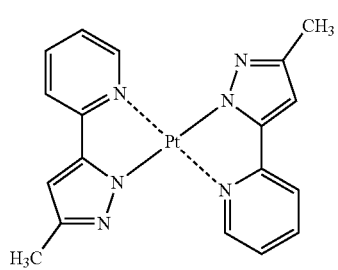
-continued
PD6
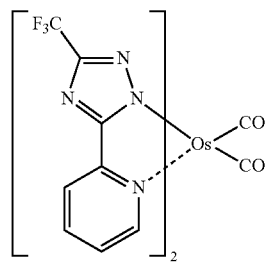
PD7
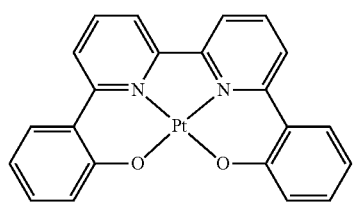
PD8
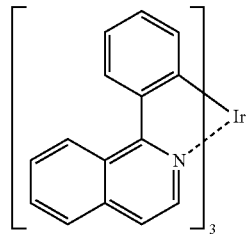
PD9
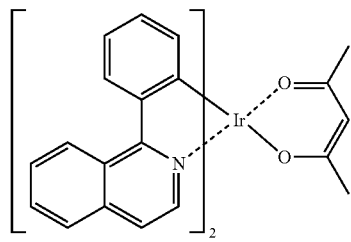
PD10
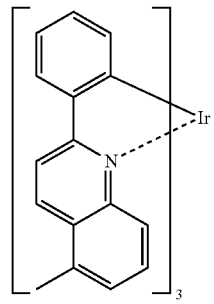
PD11
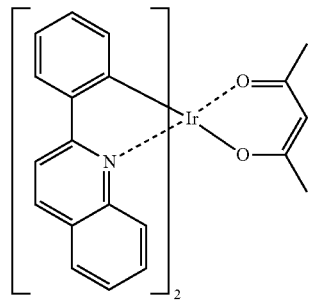

PD12 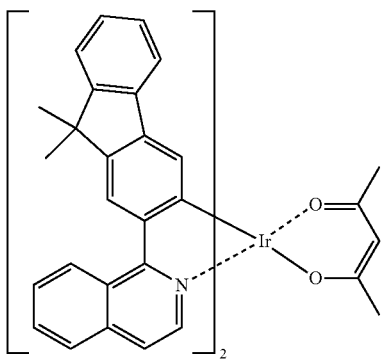
PD13 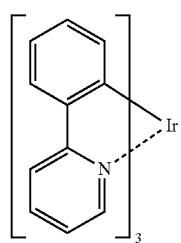
PD14 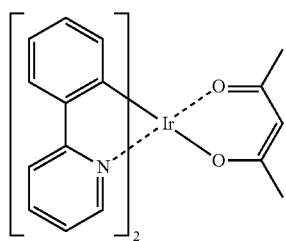
PD15 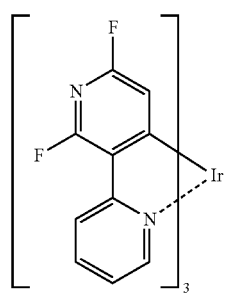
PD16 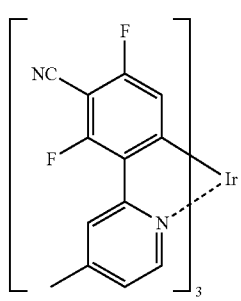
PD17 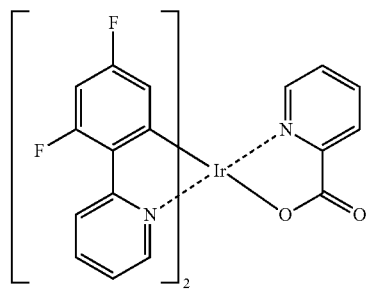
PD18 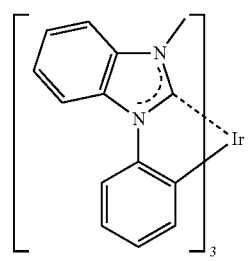
PD19 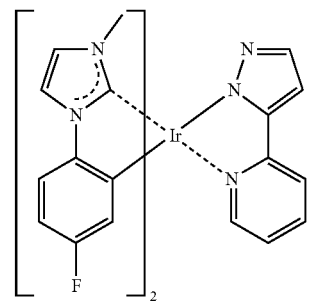
PD20 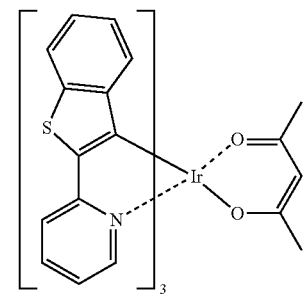
PD21 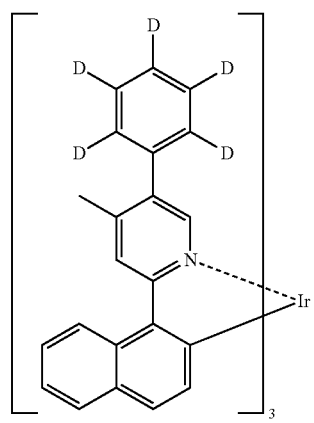

-continued
PD22
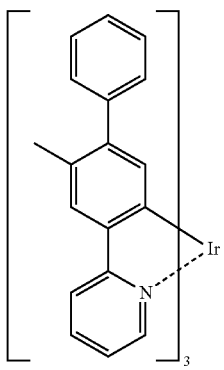
PD23
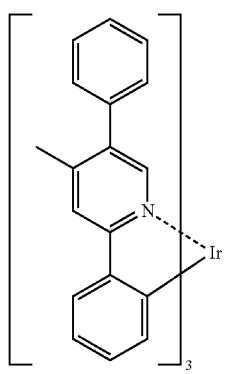
PD24
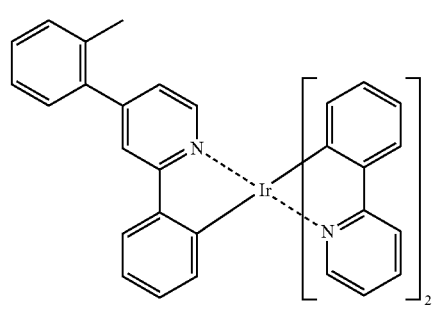
PD25
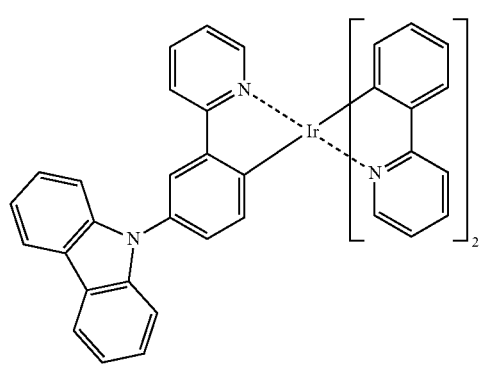
The fluorescent dopant may include an arylamine compound or a styrylamine compound.
For example, the fluorescent dopant may include at least one of the following Compounds FD1 to FD22.
FD1
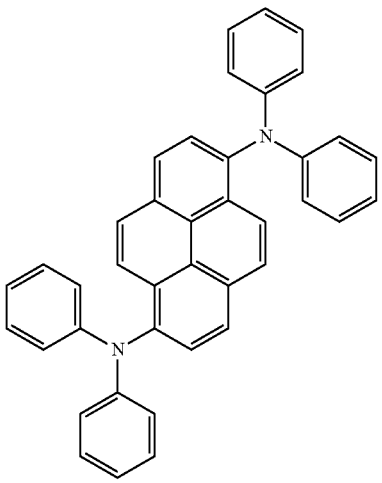
FD2
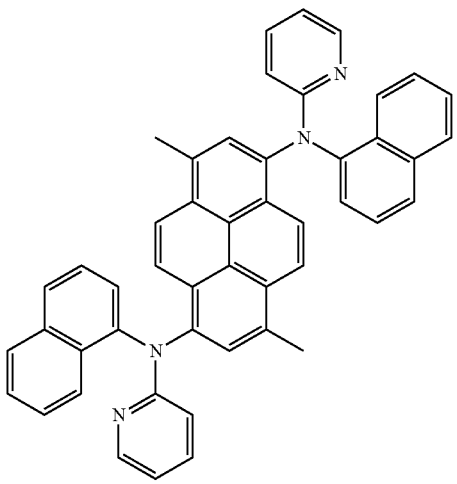
FD3
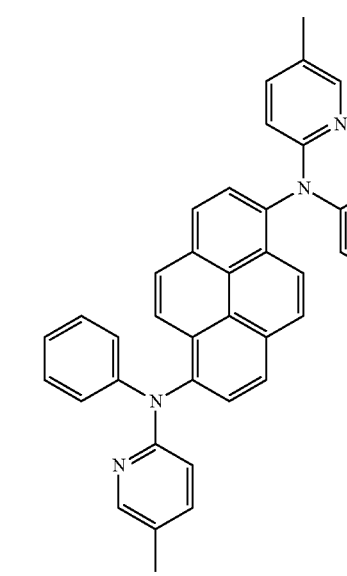

-continued
FD4
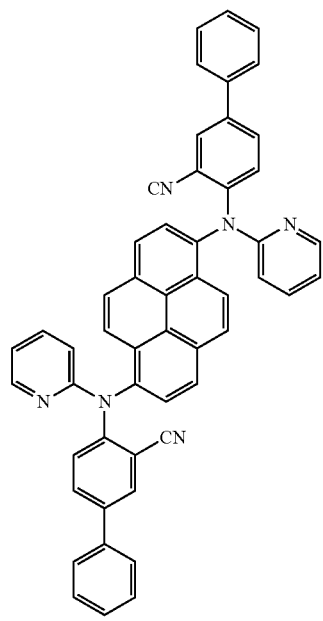
FD5
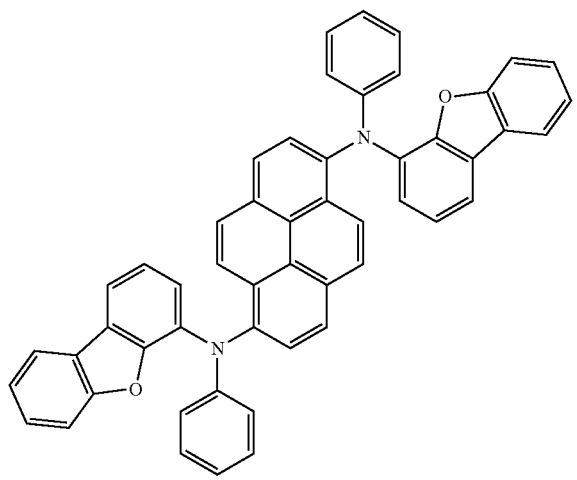
FD6
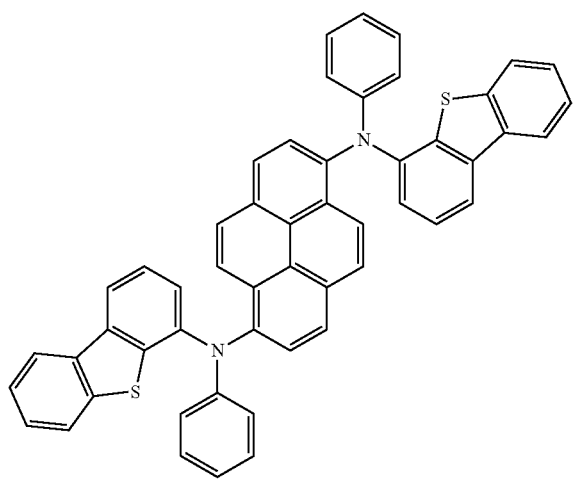
-continued
FD7
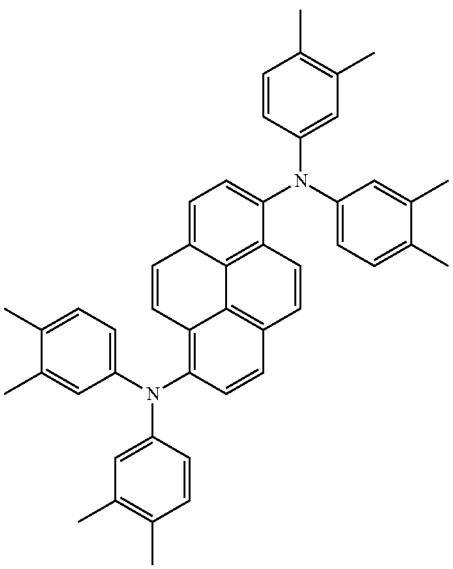
FD8
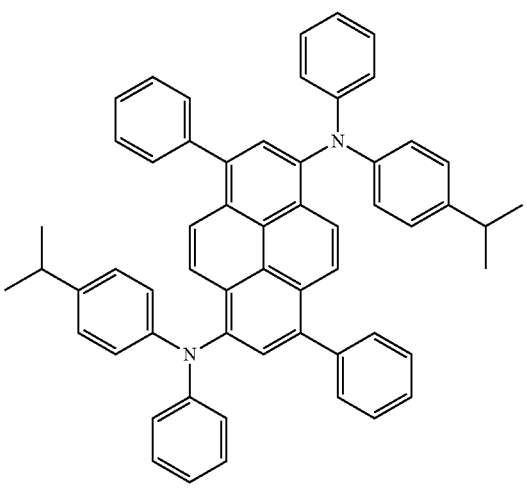
FD9
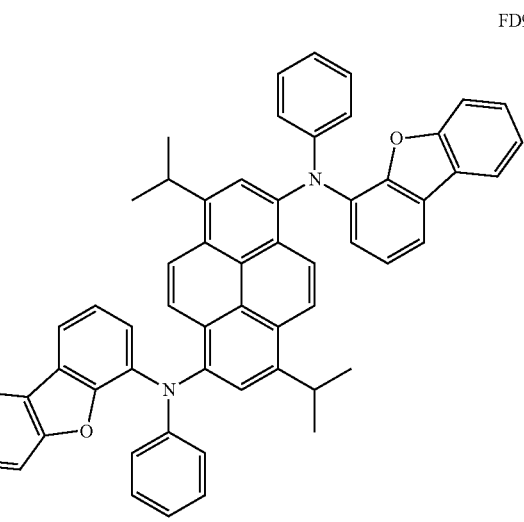

FD10
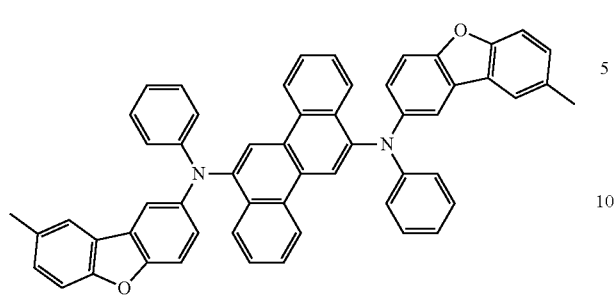
FD11
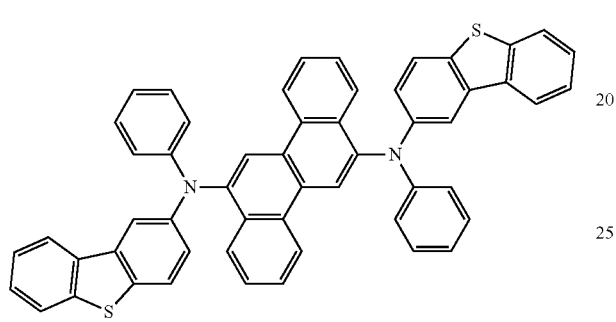
FD12
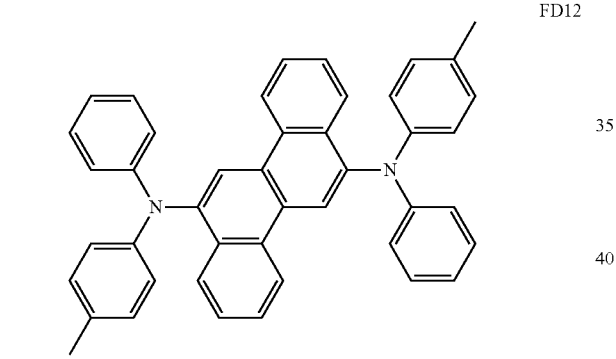
FD13
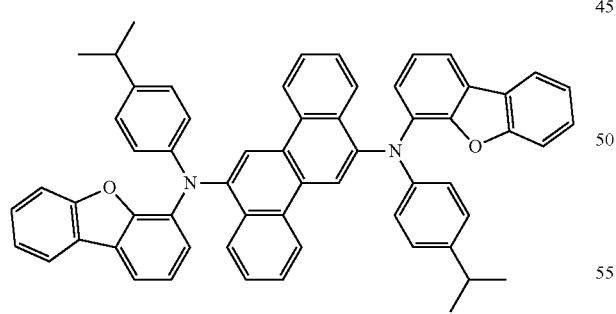
FD14
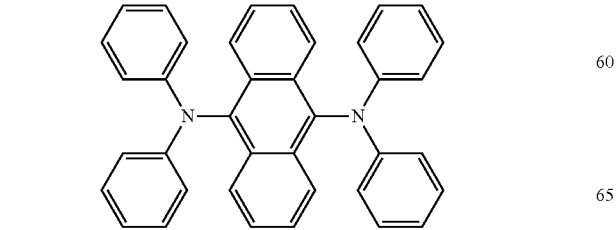
FD15
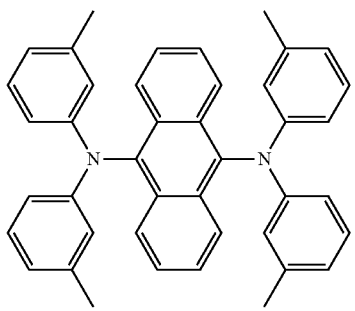
FD16
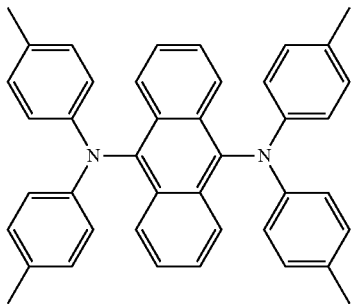
FD17
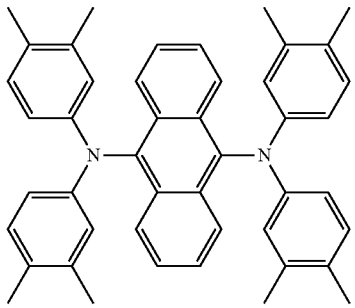
FD18
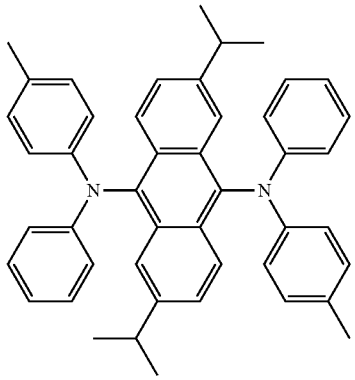

FD19
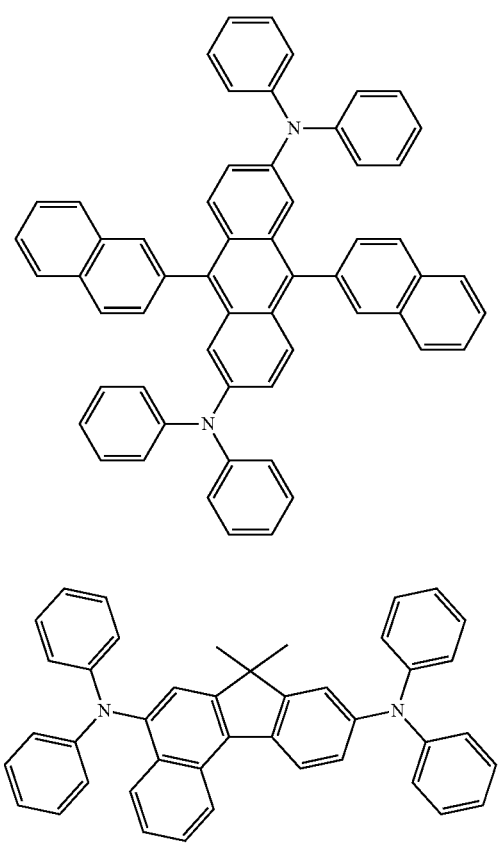
FD21
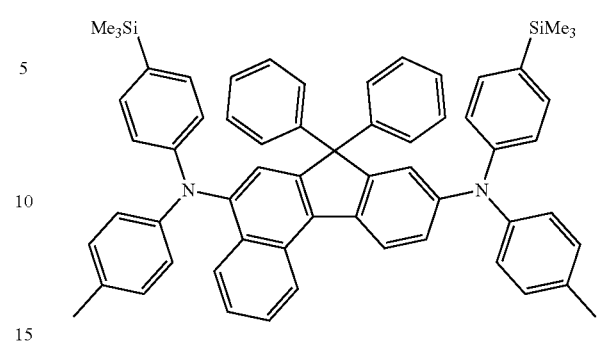
FD20
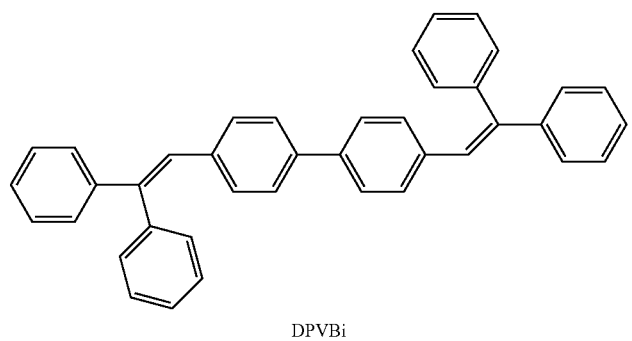
FD22
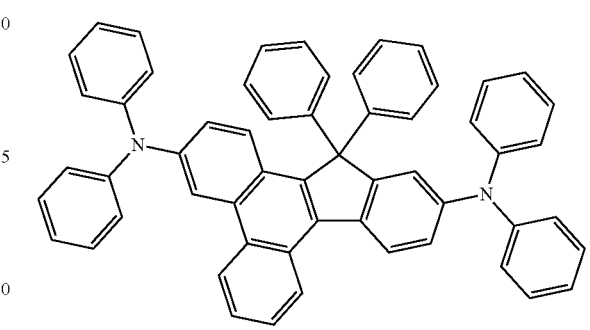
In some exemplary embodiments, the fluorescent dopant may include at least one of the following compounds.
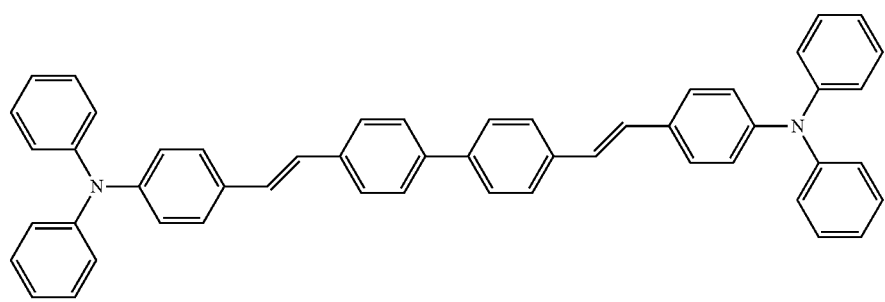
DPVBi
DPAVBi

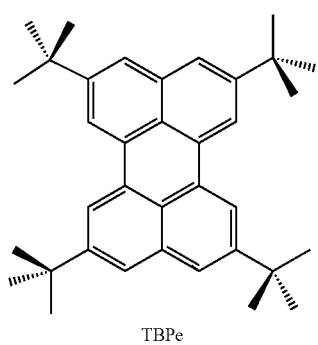

TBPe

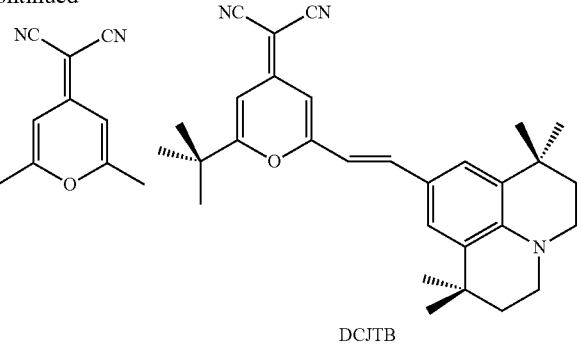

DCM            DCJTB

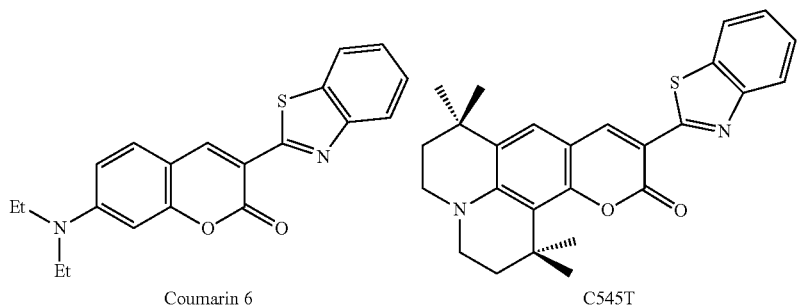

Coumarin 6            C545T

The first emission layer EM1, the second emission layer EM2 and the third emission layer EM3 may include a proper host and a proper dopant to emit a green light, a red light and a blue light, respectively.

For example, the thickness of each of the first emission layer EM1, the second emission layer EM2 and the third emission layer EM3 may be about 100 Å to about 1,000 Å.

For example, the electron-transporting layer ETL may include an electron-transporting material. For example, the electron-transporting layer ETL may include at least one of the following Compounds ET1 to ET36.

ET1

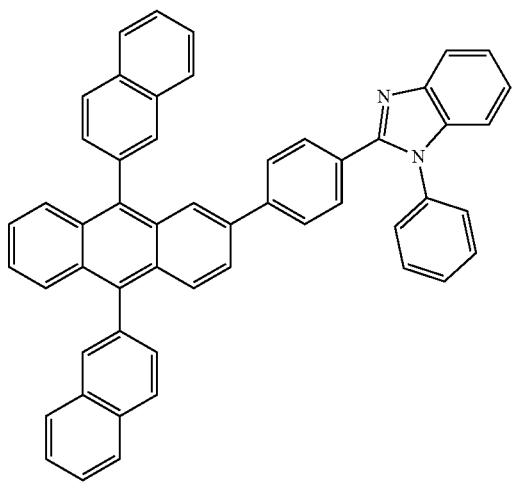

-continued

ET2

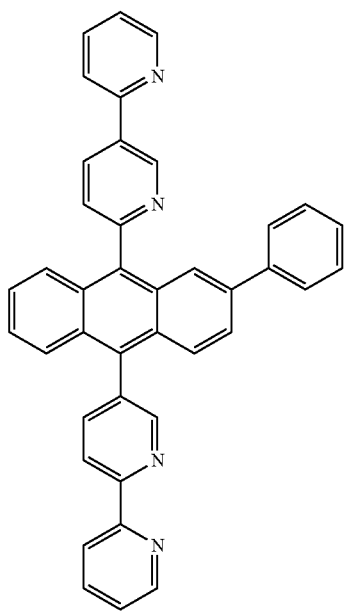

ET3
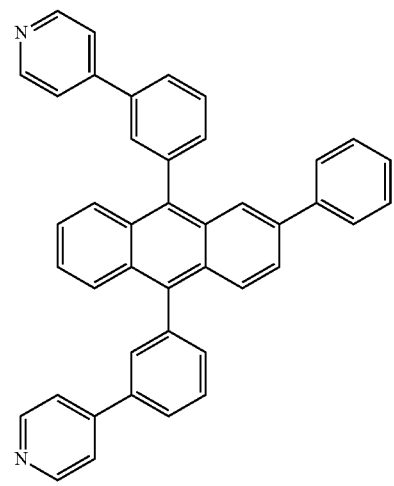
ET4
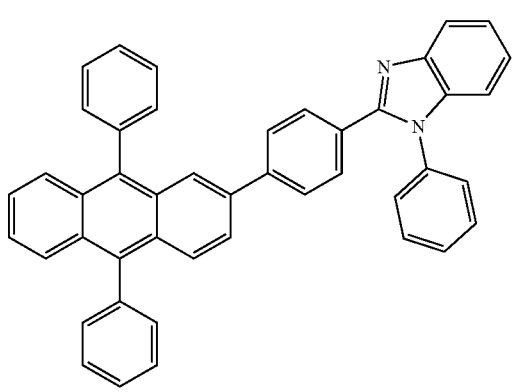
ET5
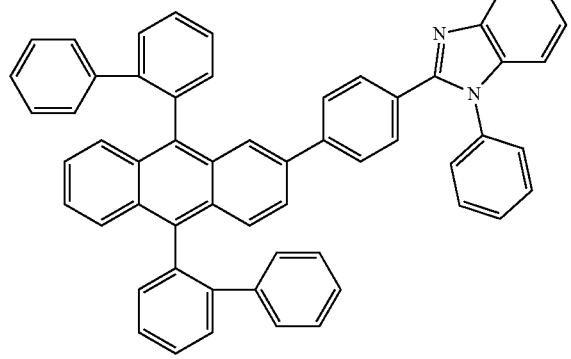
ET6
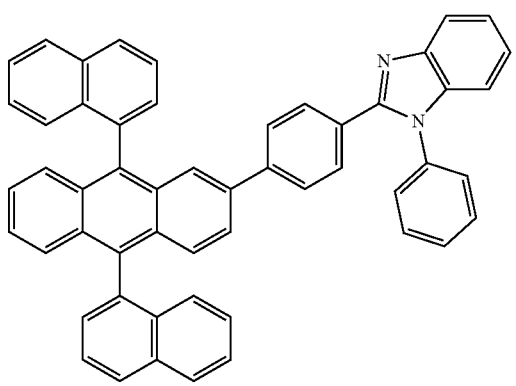
ET7
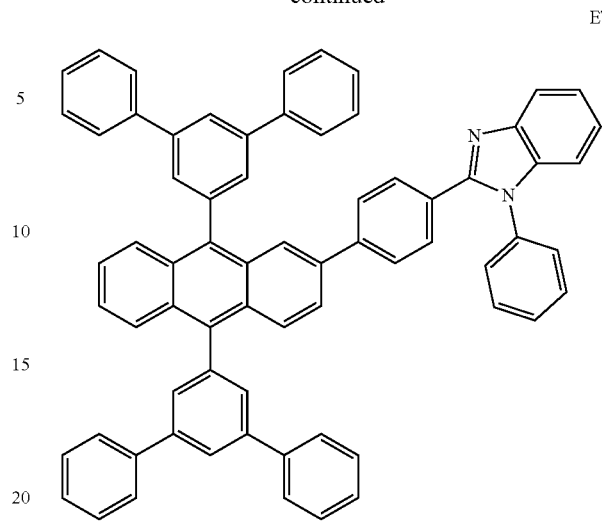
ET8
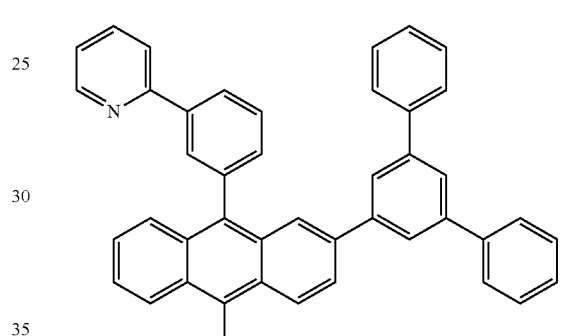
ET9
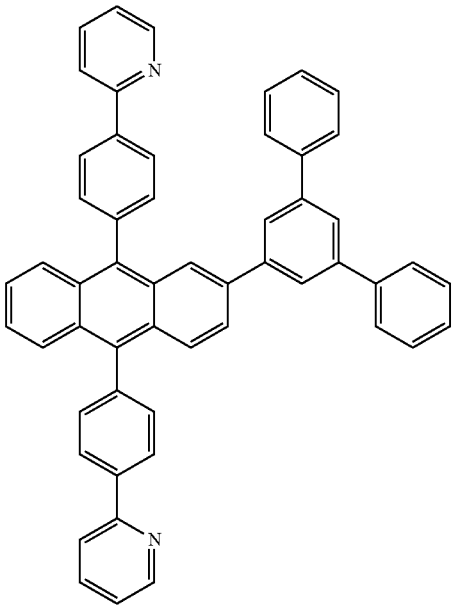

ET10
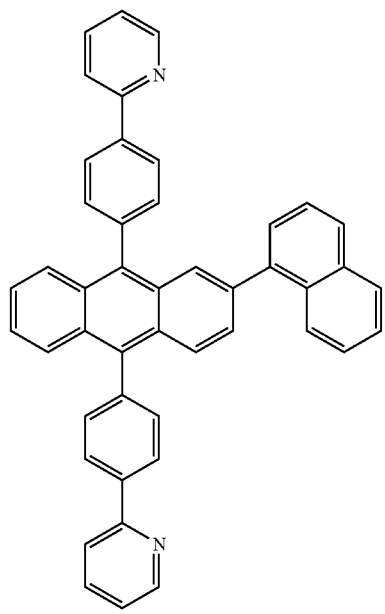
ET11
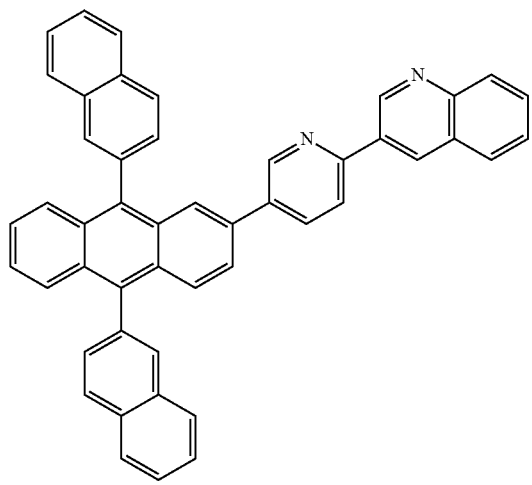
ET12
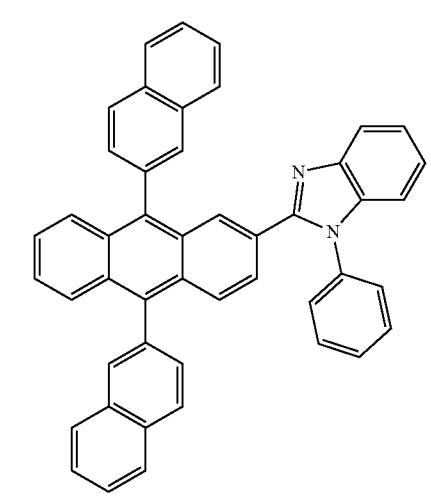
ET13
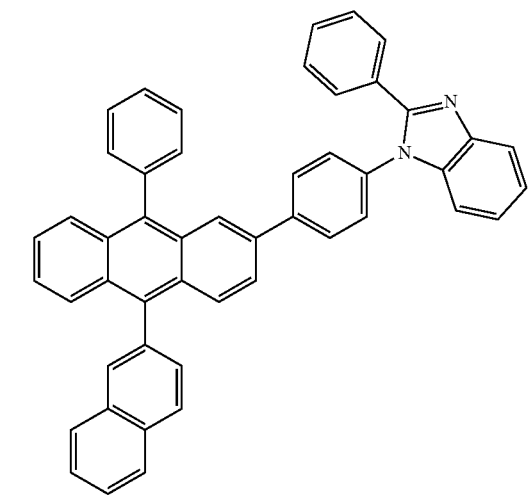
ET14
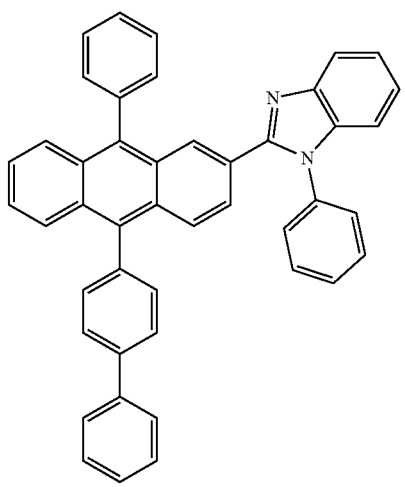
ET15
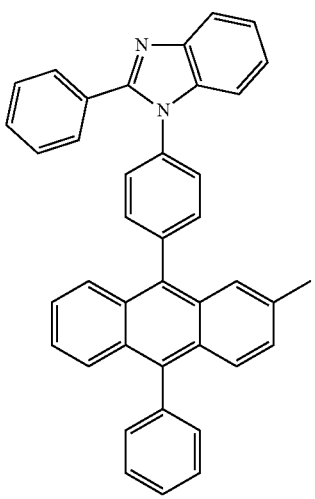

ET16
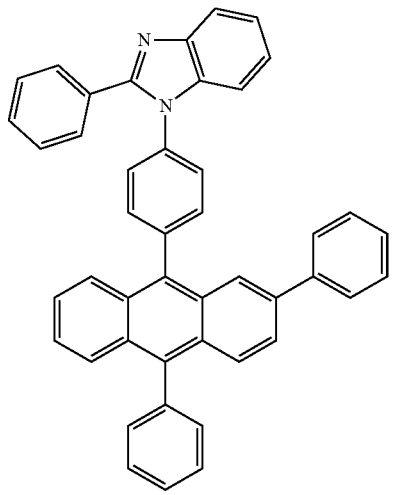
ET17
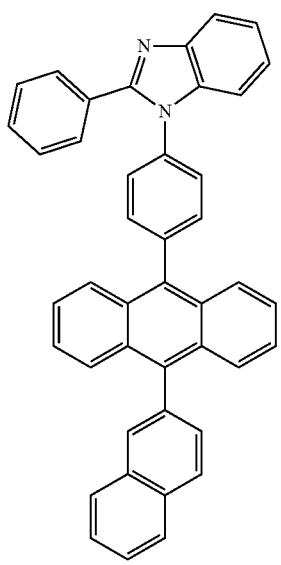
ET18
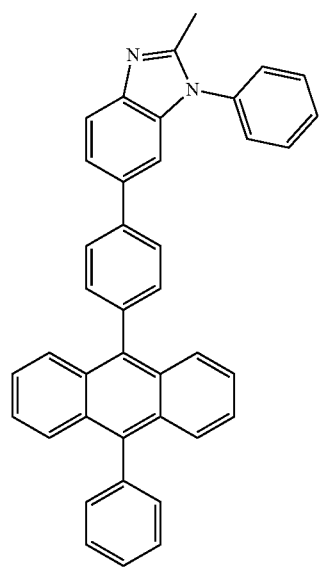
ET19
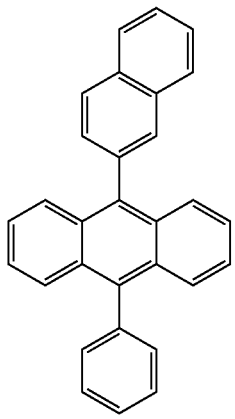
ET20
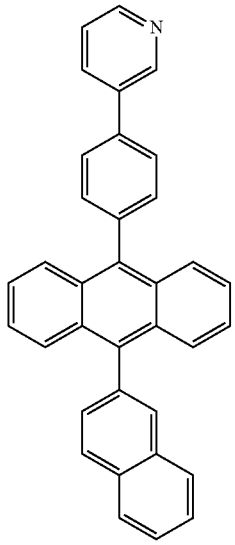
ET21
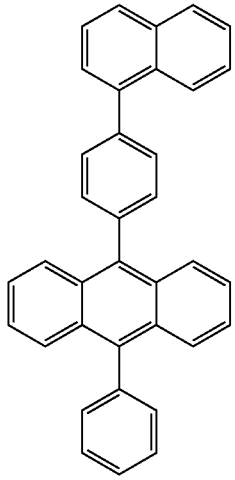

ET22
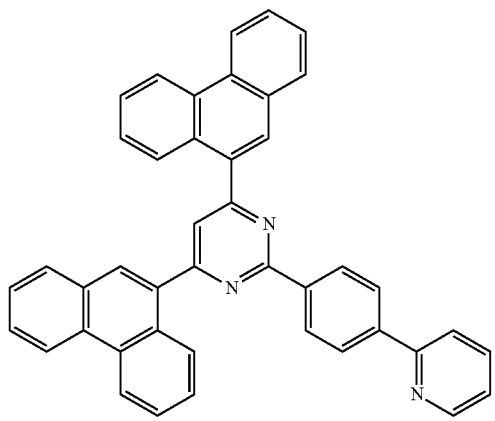
ET25
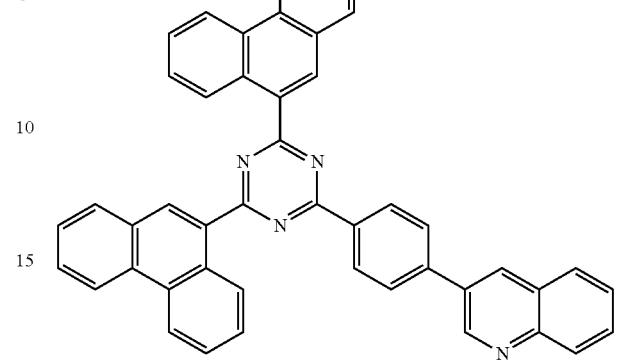
ET23
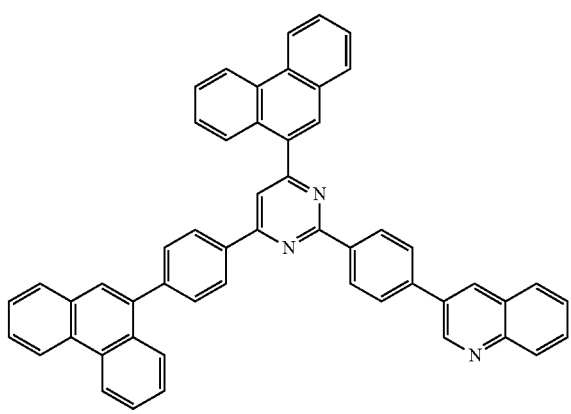
ET26
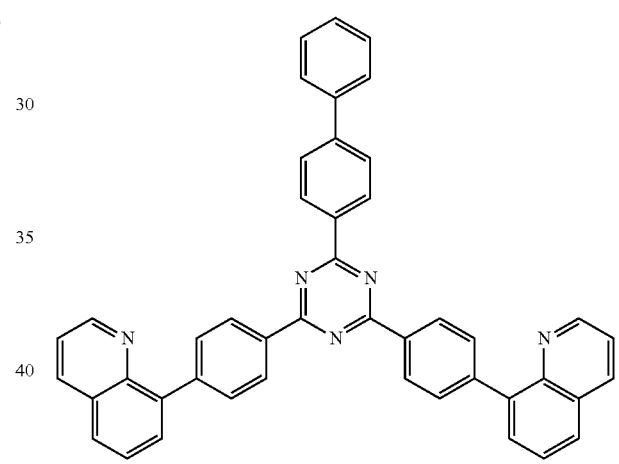
ET24
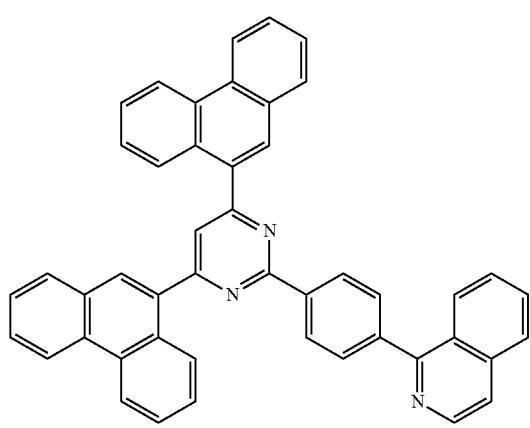
ET27
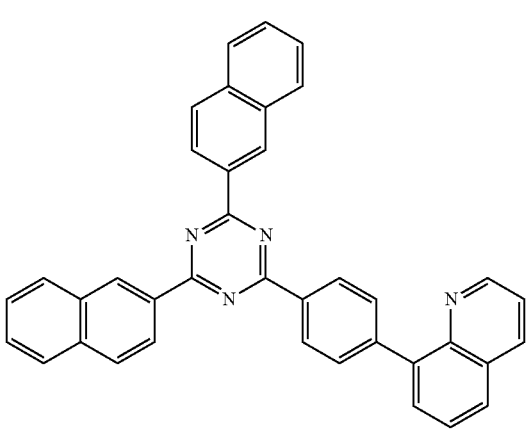

ET28
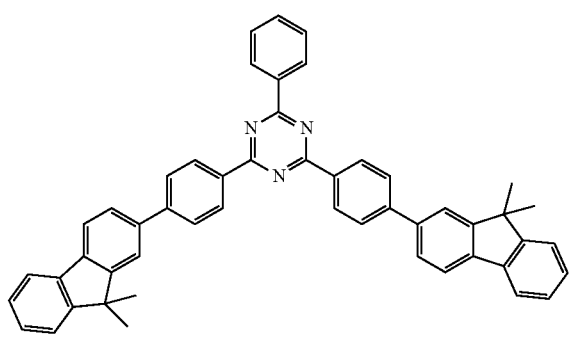
ET29
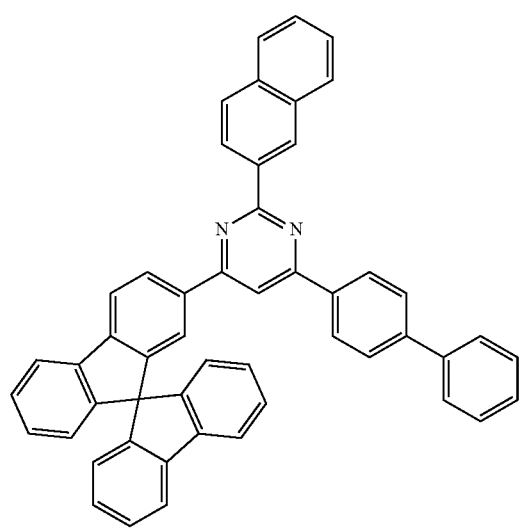
ET30
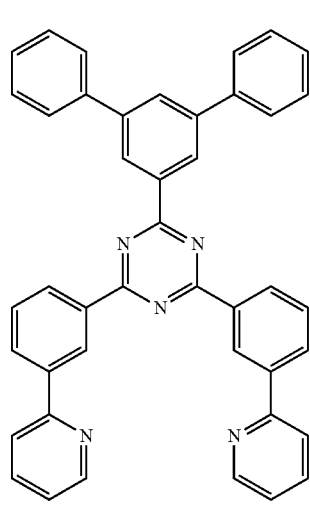
ET31
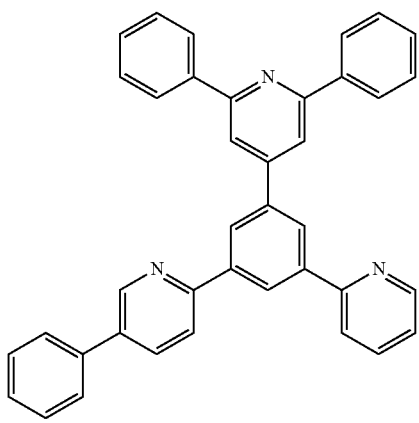
ET32
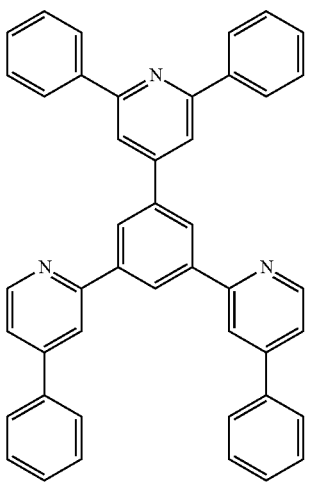
ET33
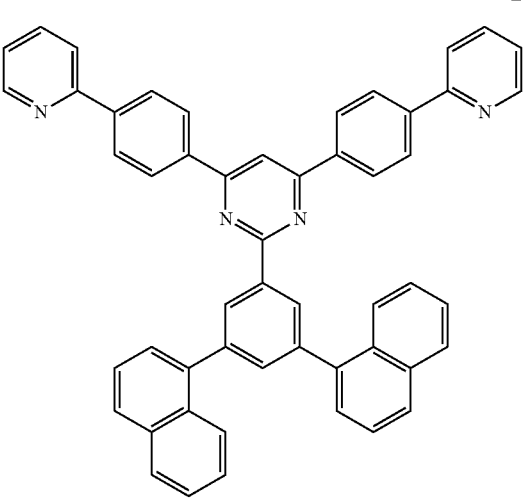

ET34

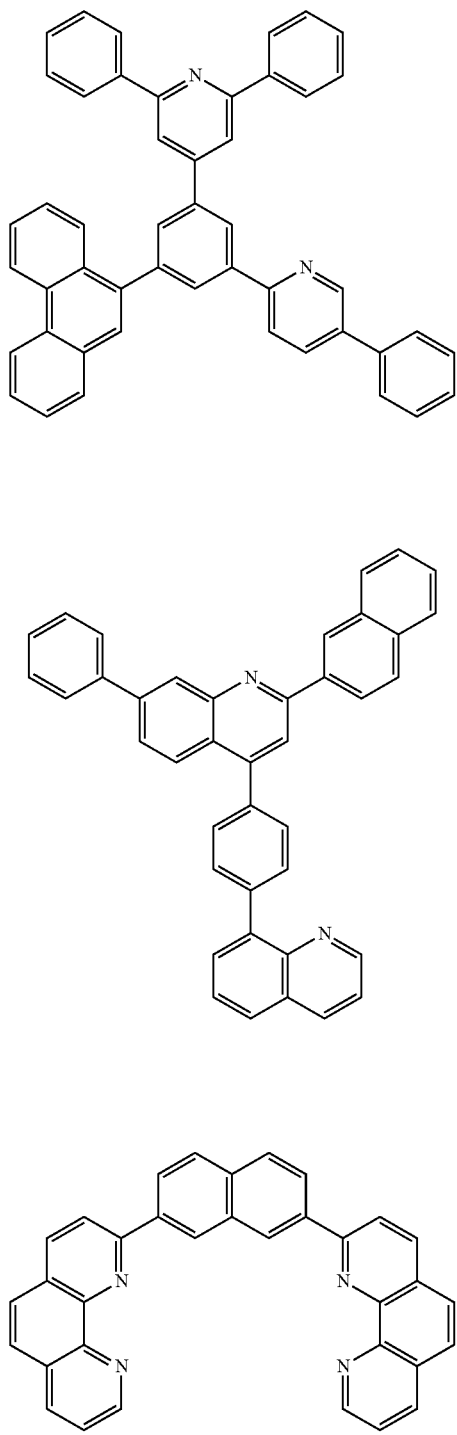

ET35

ET36

In another exemplary embodiment, the electron-transporting layer ETL may include at least one compound of 2,9-dimethyl-4,7-diphenyl-1,10-phenanthroline (BCP), 4,7-diphenyl-1,10-phenanthroline (Bphen), tris-(8-hydroxyquinoline)aluminum (Alq₃), bis(8-hydroxy-2-methylquinoline)-(4-phenylphenoxy)aluminum (BAlq), 3-(biphenyl-4-yl)-5-(4-tert-butylphenyl)-4-phenyl-4H-1,2,4-triazole (TAZ), and 4-naphthalen-1-yl-3,5-diphenyl-1,2,4-triazole (NTAZ).

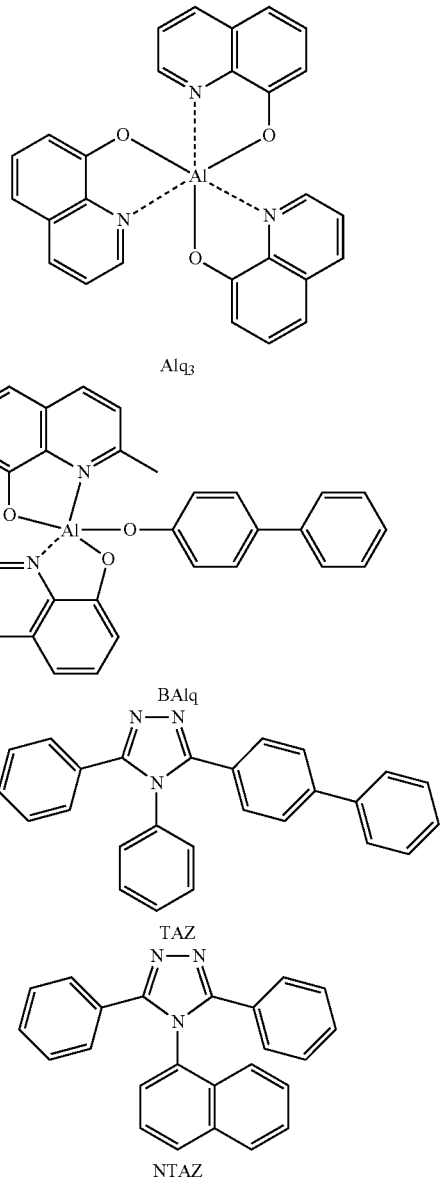

The electron-injection layer EIL may promote injection of electrons from the common electrode CE. The electron-injection layer EIL may contact the common electrode CE, and may have a single-layered structure or a multi-layered structure having a plurality of layers including different materials.

For example, the electron-injection layer EIL may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, or Cs. The alkaline earth metal may be selected from magnesium (Mg), calcium (Ca), strontium (Sr), and barium (Ba). The rare earth metal may be selected from scandium (Sc), yttrium (Y), cerium (Ce), terbium (Tb), ytterbium (Yb), or gadolinium (Gd).

The alkali metal compound, the alkaline earth-metal compound, and the rare earth metal compound may be selected from oxides or halides (for example, fluorides, chlorides, bromides, or iodides) of the alkali metal, the alkaline earth metal, or the rare earth metal.

For example, the alkali metal compound may be selected from alkali metal oxides, such as $Li_2O$, $Cs_2O$ or $K_2O$, and alkali metal halides, such as LiF, NaF, CsF, KF, LiI, NaI, CsI, or KI. The alkaline earth-metal compound may be selected from alkaline earth-metal oxides, such as BaO, SrO, CaO, $Ba_xSr_{1-x}O$ (0<x<1) or $Ba_xCa_{1-x}O$ (0<x<1). The rare earth metal compound may be selected from $YbF_3$, $ScF_3$, $ScO_3$, $Y_2O_3$, $Ce_2O_3$, $GdF_3$, or $TbF_3$.

The electron-injection layer EIL may include (e.g., consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In some exemplary embodiments, the electron-injection layer EIL may further include an organic material. When the electron-injection layer EIL further includes the organic material, the alkali metal, alkaline earth metal, rare earth metal, alkali metal compound, alkaline earth metal compound, rare earth metal compound, alkali metal complex, alkaline earth metal complex, rare earth metal complex, or a combination thereof may be homogeneously or non-homogeneously dispersed in a matrix including the organic material.

The organic light-emitting structure OL may further include at least one of a buffer layer, a hole-blocking layer and an electron-control layer in addition to the above functional layers.

In some exemplary embodiments, materials of the emission layer, the hole-transporting layer HTL and the auxiliary layer may be selected and combined with each other such that a hole barrier, which may be an absolute value of difference of highest occupied molecular orbital (HOMO) levels, of an interface of the emission layer and the hole-transporting region is equal to or less than about 0.1 eV. When the hole barrier of the emission layer and the hole-transporting region is equal to or less than about 0.1 eV, the capacitance of the light-emitting element may be effectively reduced.

Furthermore, a hole mobility, which may be field dependent mobility, of the hole-transporting region including the auxiliary layer and the hole-transporting layer HTL may be equal to or less than about $1.0\times10^{-3}$ $cm^2/V\cdot s$.

In some exemplary embodiments, materials of the emission layer, the hole-transporting layer HTL and the auxiliary layer may be selected and combined with each other such that an electron barrier, which may be an absolute value of difference of lowest unoccupied molecular orbital (LUMO) levels, of an interface of the emission layer and the hole-transporting region is equal to or less than about 0.3 eV, preferably, equal to or less than about 0.2 eV. For example, the electron barrier of the interface the emission layer and the hole-transporting region is may be about 0.1 eV to about 0.3 eV, or may be about 0.1 eV to about 0.2 eV.

In some exemplary embodiments, a hole concentration of the hole-transporting region may be equal to or less than about $2.0\times10^{18}/cm^3$, and may be preferably equal to or less than about $1.0\times10^{18}/cm^3$. In some exemplary embodiments, a hole mobility of the emission layer may be more about $1.0\times10^{-7}$ $cm^2/V\cdot s$ than and less than about $1.0\times10^{-5}$ $cm^2/V\cdot s$. For example, the hole mobility of the emission layer may be about $5.0\times10^{-6}$ $cm^2/V\cdot s$ to about $5.0\times10^{-7}$ $cm^2/V\cdot s$.

In some exemplary embodiments, a hole mobility of the hole-transporting region may be equal to or less than about $1.0\times10^{-5}$ $cm^2/V\cdot s$.

According to some exemplary embodiments, light-emitting difference between light-emitting elements emitting different color lights due to material difference may be improved. For example, a light-emitting material of the emission layer for a green light may trap more electric charge than light-emitting materials of the emission layers for a red light and a blue light. Thus, under the same condition, the light-emitting element for a green light may have a capacitance greater than the light-emitting elements for a red light and a blue light. Thus, light emission of the green light-emitting element may be delayed, for example, at a low gray-scale, with compared to the red and blue light-emitting elements.

In some exemplary embodiments, the hole mobility of the hole-transporting layer HTL and the first auxiliary layer RL1 may be may be equal to or less than about $1.0\times10^{-3}$ $cm^2/V\cdot s$, and the hole barrier of the interface of the first auxiliary layer RL1 and the first emission layer EL1 may be equal to or less than about 0.1 eV.

Furthermore, the hole-transporting layer HTL and the first auxiliary layer RL1 may not include a p-dopant. Thus, the hole-transporting layer HTL and the first auxiliary layer RL1 may consist of organic materials without a metallic dopant. The hole-transporting layer HTL and the first auxiliary layer RL1 may include the same material.

The above configuration may reduce the capacitance of the green light-emitting element so that the capacitance difference between the light-emitting elements emitting difference color lights may be reduced. Thus, color bleeding due to light emission delay of the green light-emitting element may be improved. However, the exemplary embodiments are not limited to a green light-emitting element, and may be applied for a red light-emitting element, a blue light-emitting element or other light-emitting elements emitting a light different from a green light, a red light and a green light.

Figure 3:
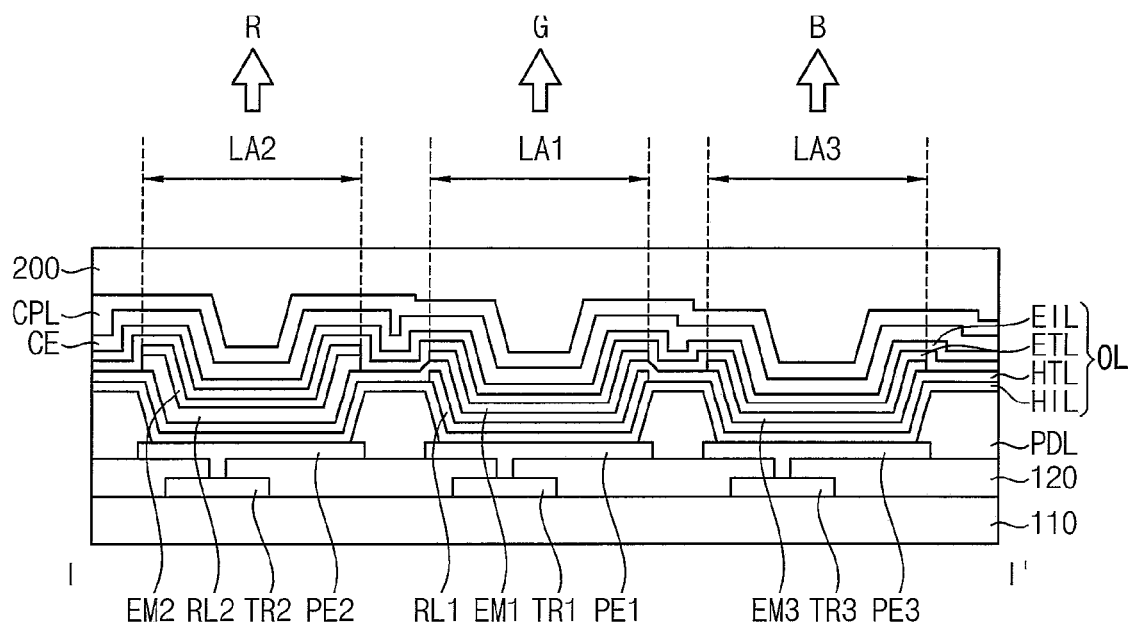
FIG. 3 is a cross-sectional view taken along the line I-I' of FIG. 1 illustrating another exemplary embodiment of a representative pixel area of the display device constructed according to principles of the invention.

FIG. 3 is a cross-sectional view taken along the line I-I' of FIG. 1 illustrating another exemplary embodiment of a representative pixel area of the display device constructed according to principles of the invention.

In some exemplary embodiments, an organic light-emitting structure OL disposed between a first electrode and a second electrode of a light-emitting element may include a hole-injection layer HIL, a hole-transporting layer HTL, an auxiliary layer RM1 and RM2, an emission layer EM1, EM2 and EM3, an electron-transporting layer ETL and an electron-injection layer EIL. In some exemplary embodiments, the emission layer may include a first emission layer EL1 configured to generate a green light, a second emission layer EL2 configured to generate a red light, and a third emission layer EL3 configured to generate a blue light.

In some exemplary embodiments, the hole-injection layer HIL, the hole-transporting layer HTL, the electron-transporting layer ETL and the electron-injection layer EIL may be disposed as a common layer continuously extending in the organic light-emitting structure OL. The first to third emission layers EM1, EM2 and EM3 may be disposed selectively in a corresponding light-emitting area to have a separated pattern shape.

In some exemplary embodiments, the auxiliary layer may include a first auxiliary layer RL1 overlapping a first light-emitting area LA1, and a second auxiliary layer RL2 overlapping a second light-emitting area LA2. The first auxiliary layer RL1 may be disposed between the hole-injection layer HIL and the hole-transporting layer HTL in the first light-emitting area LA1. Thus, the hole-transporting layer HTL may contact the first emission layer EM1.

The second auxiliary layer RL2 may be disposed between the second emission layer EM2 and the hole-transporting layer HTL in the second light-emitting area LA2. However, the exemplary embodiments are not limited thereto. For example, the second auxiliary layer RL2 may be disposed between the hole-injection layer HIL and the hole-transporting layer HTL.

In some exemplary embodiments, the hole mobility of the hole-transporting layer HTL and the first auxiliary layer RL1 may be may be equal to or less than about $1.0 \times 10^{-3}$ cm$^2$/V·s, and the hole barrier of the interface of the hole-transporting layer HTL and the first emission layer EL1 may be equal to or less than about 0.1 eV.

Hereinafter, effects of examples will be explained with reference to experimental results.

Example 1

HT3 and NDP-9 (from Novaled GmbH) were co-deposited on an ITO glass substrate (15 Ω/cm², 1,200 Å) from Corning, Inc. of Corning, New York (hereinafter "Corning") at a weight ratio of 99:1 to a thickness of 50 Å to form a hole-injection layer. Thereafter, HT3 was deposited on the hole-injection layer to a thickness of 220 Å to form a hole-transporting layer.

HT3 was deposited on the hole-transporting layer to a thickness of 100 Å to form an auxiliary layer. H39/H45 (host) and PD24 (green dopant) were co-deposited on the auxiliary layer at a weight ratio of 94:6 to form a green organic emission layer having a thickness of 250 Å. ET27 and lithium quinolate (Liq) were co-deposited on the green organic emission layer at a weight ratio of 1:1 to form an electron-transporting layer having a thickness of 280 Å. Yb was deposited on the electron-transporting layer to form an electron-injection layer having a thickness of 13 Å, and Ag and Mg were co-deposited on the electron-injection layer at a weight ratio of 9:1 to form a cathode having a thickness of 130 Å, thereby forming a Yb/Ag:Mg electrode to manufacture a light-emitting device.

Comparative Example 1

HT3 and NDP-9 were co-deposited on a Corning ITO glass substrate (15 Ω/cm², 1,200 Å) at a weight ratio of 99:1 to a thickness of 50 Å to form a hole-injection layer. Thereafter, HT3 was deposited on the hole-injection layer to a thickness of 220 Å to form a hole-transporting layer.

NDP-9 and the compound represented by the following Formula 1 was deposited on the hole-transporting layer at a weight ratio of 99:1 to a thickness of 50 Å, and the compound represented by the following Formula 1 was deposited thereon to a thickness of 50 Å to form an auxiliary layer.

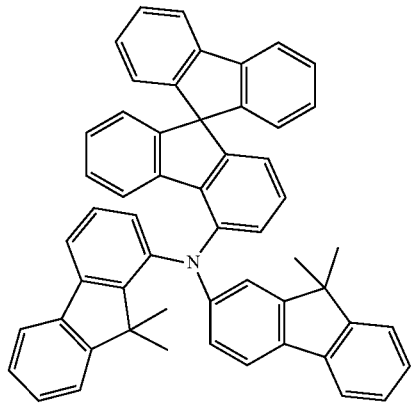

Formula 1

H39/H45 (host) and PD24 (green dopant) were co-deposited on the auxiliary layer at a weight ratio of 94:6 to form a green organic emission layer having a thickness of 250 Å.

ET27 and Liq were co-deposited on the green organic emission layer at a weight ratio of 1:1 to form an electron-transporting layer having a thickness of 280 Å. Yb was deposited on the electron-transporting layer to form an electron-injection layer having a thickness of 13 Å, and Ag and Mg were co-deposited on the electron-injection layer at a weight ratio of 9:1 to form a cathode having a thickness of 130 Å, thereby forming a Yb/Ag:Mg electrode to manufacture a light-emitting device.

Figure 4A:
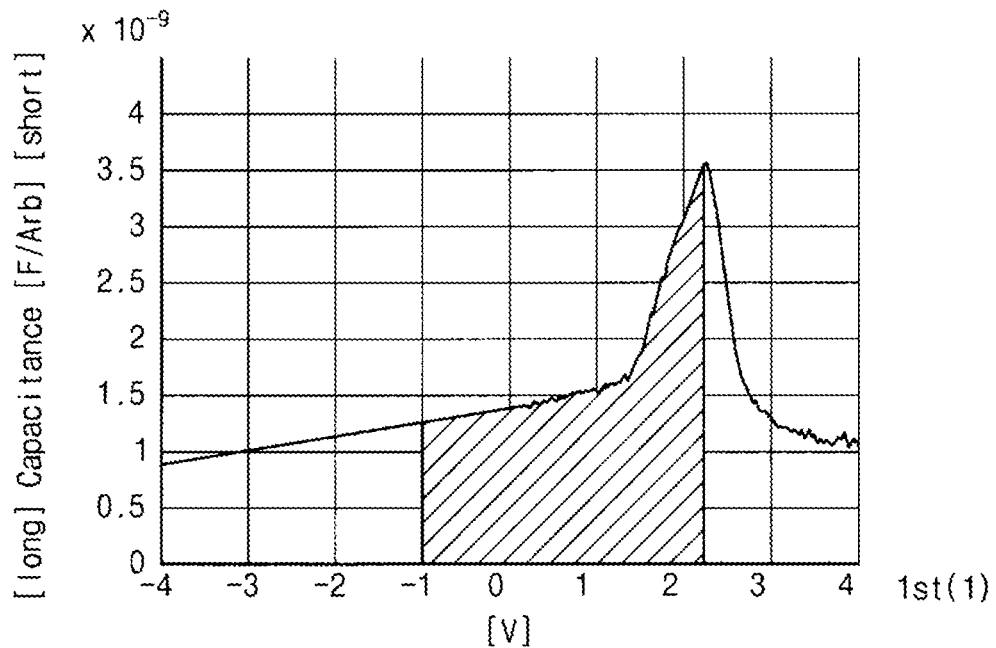
FIGS. 4A and 4B are graphical depictions illustrating capacitance variance of light-emitting elements of Comparative Example 1 and Example 1.
Figure 4B:
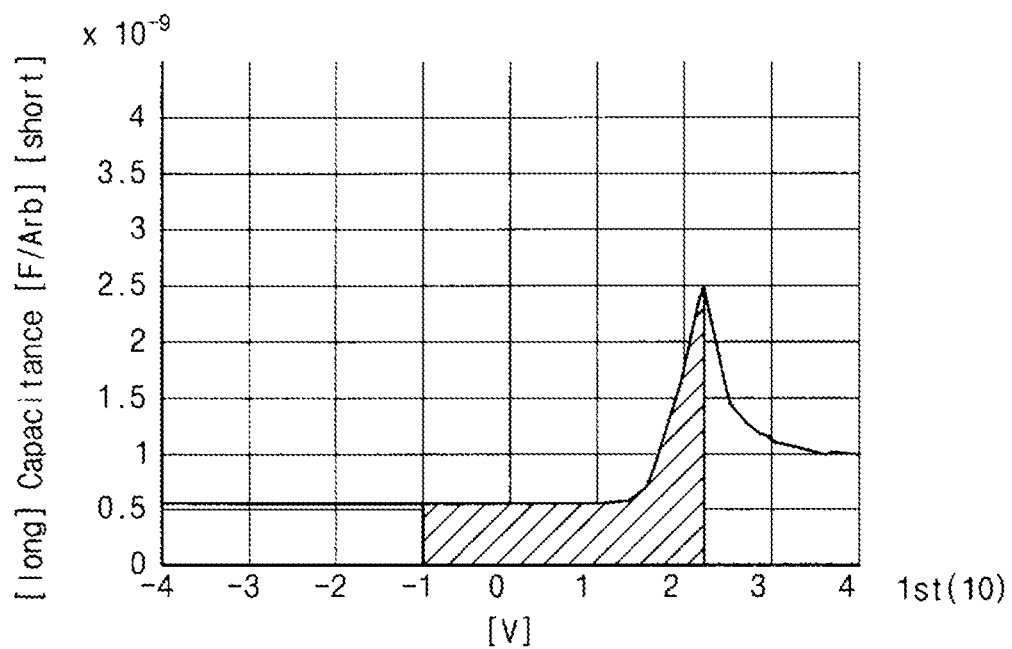

FIGS. 4A and 4B are graphical depictions illustrating capacitance variance of light-emitting elements of Comparative Example 1 and Example 1.

Referring to FIGS. 4A and 4B, the capacitance of the light-emitting element of Example 1 as depicted in FIG. 4B has a significant and unexpectedly less capacitance as compared to the light-emitting element of Comparative Example 1 as depicted in FIG. 4A. Furthermore, the quantity of accumulated electric charge, which mainly affects the starting time of light emission and may be defined by an integral-calculated value between about −1V to about 2.23V in the experiment, of the light-emitting element of Example 1 was significant and unexpectedly reduced to be about 43% to that of the light-emitting element of Comparative Example 1. Thus, it can be noted that light emission delay of the green light-emitting element may be improved by the light-emitting element of Example 1.

A simulation was performed by using parameters of Example 1 to verify quantity variance of accumulated electric charge depending on a hole barrier (HOMO level difference) between a hole-transporting region and an emission layer and to verify quantity variance of accumulated electric charge depending on a hole mobility of a hole-transporting region.

Figure 5A:
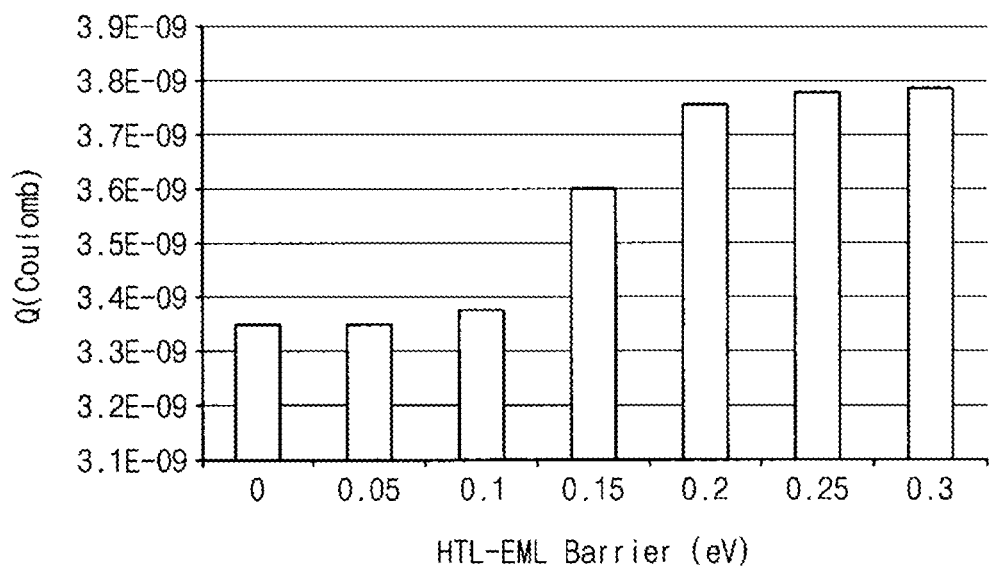
FIG. 5A is a graphical depiction illustrating quantity variance of accumulated electric charge depending on a hole barrier between a hole-transporting region and an emission layer for comparative and exemplary embodiments.
Figure 5B:
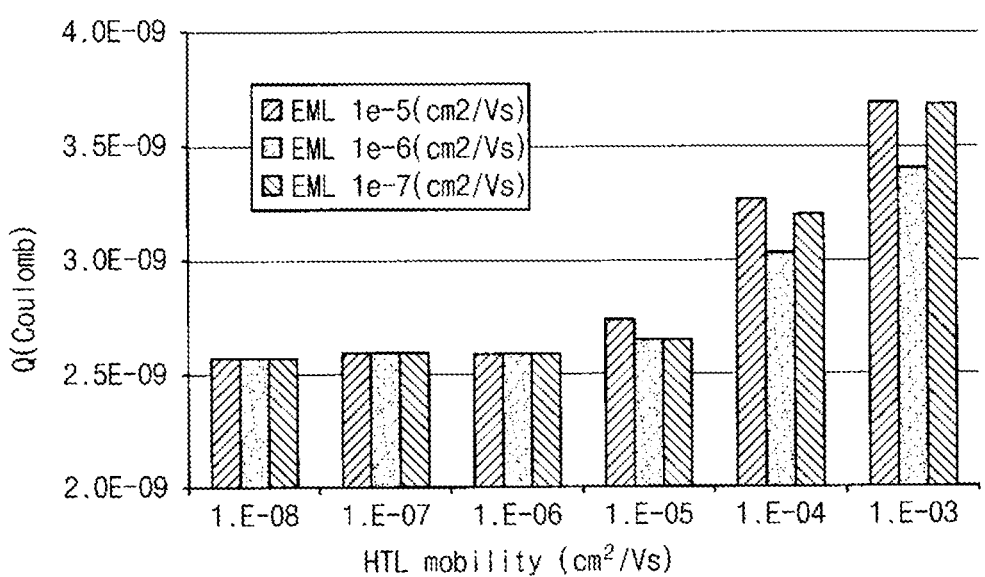
FIG. 5B is a graphical depiction illustrating quantity variance of accumulated electric charge depending on quantity variance of accumulated electric charge depending on a hole mobility of a hole-transporting region for exemplary embodiments.

FIG. 5A is a graphical depiction illustrating quantity variance of accumulated electric charge depending on a hole barrier between a hole-transporting region and an emission layer for comparative and exemplary embodiments. FIG. 5B is a graphical depiction illustrating quantity variance of accumulated electric charge depending on quantity variance of accumulated electric charge depending on a hole mobility of a hole-transporting region for exemplary embodiments.

The simulation was performed based on the parameters of Example 1, represented by the following Table 1. The following parameters were measured and simulated by software sold under the trade designation PAIOS and SETFOS of FLUXim AG of Zurich, Switzerland, and medians of values measured by 10 times.

TABLE 1

| Parameter | Unit | Hole-transporting region | Emission layer | Electron-transporting layer | Anode | Cathode |
|---|---|---|---|---|---|---|
| Zero Field Hole Mobility | $cm^2/V \cdot s$ | $8.0 \times 10^{-4}$ | $1.0 \times 10^{-6}$ | $4.0 \times 10^{-7}$ | — | — |
| Characteristic Field for Hole | V/cm | $6.0 \times 10^{-3}$ | $1.0 \times 10^{-3}$ | $6.0 \times 10^{-3}$ | — | — |
| Zero Field Electron Mobility | $cm^2/V \cdot s$ | $7.0 \times 10^{-5}$ | $5.0 \times 10^{-4}$ | $1.0 \times 10^{-4}$ | — | — |
| Characteristic Field for Electron | V/cm | $2.3 \times 10^{-3}$ | $1.0 \times 10^{-4}$ | $3.0 \times 10^{-3}$ | — | — |
| HOMO Level | eV | −5.1 | −5.2 | −5.8 | — | — |
| LUMO Level | eV | −2.0 | −2.2 | −2.2 | — | — |
| Trap for Hole | $cm^{-3}$ | $1.0 \times 10^{18}$ | $1.0 \times 10^{17}$ | $3.4 \times 10^{18}$ | — | — |
| Trap for Electron | $cm^{-3}$ | $1.0 \times 10^{17}$ | $1.0 \times 10^{17}$ | $1.0 \times 10^{18}$ | — | — |
| Work function | eV | — | — | — | −5.0 | −2.25 |

Referring to FIG. 5A, the quantity of accumulated electric charge may be decreased when the hole barrier between the hole-transporting region and the emission layer is equal to or less than 0.1 eV. Furthermore, referring to FIG. 5B3, when the hole mobility of the emission layer EML was $1.0 \times 10^{-6}$ $cm^2/V \cdot s$ and the hole mobility of the hole-transporting layer was in a rage of $1.0 \times 10^{-4}$ $cm^2/V \cdot s$ to $1.0 \times 10^{-3}$ $cm^2/V \cdot s$, the quantity of accumulated electric charge was significant and unexpectedly decreased even more. Similarly, when the hole mobility of the hole-transporting layer was equal to or less than $1.0 \times 10^{-5}$ $cm^2/V \cdot s$, the quantity of accumulated electric charge was significant and unexpectedly decreased even more.

Organic light-emitting layers constructed according to the principles and exemplary embodiments of the invention may be applied to or incorporated into various types of display devices, including for example, a vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display device comprising:
   a plurality of pattern electrodes;
   a hole-transporting layer disposed on the plurality of pattern electrodes;
   a plurality of emission layers disposed on the hole-transporting layer and overlapping the plurality of pattern electrodes, respectively;
   a common electrode disposed on the emission layers; and
   a first auxiliary layer disposed between a first one of the pattern electrodes and a first one of the emission layers,
   wherein the hole-transporting layer HTL and the first auxiliary layer include organic materials without a metallic dopant,
   wherein the first one of the emission layers comprises a host and a dopant to emit a green light,
   wherein the first one of the emission layers forms an interface with the hole-transporting layer HTL or the first auxiliary layer, the interface having a hole barrier equal to or less than about 0.1 eV,
   wherein the hole-transporting layer and the first auxiliary layer have a hole mobility equal to or less than about $1.0 \times 10^{-4}$ $cm^2/V \cdot s$,
   wherein the first one of the emission layers has a hole mobility of greater than about $1.0 \times 10^{-7}$ $cm^2/V \cdot s$ and less than about $1.0 \times 10^{-5}$ $cm^2/V \cdot s$,
   wherein one of the hole-transporting layer and the first auxiliary layer, which forms the interface with the first one of the emission layers, consists of the following HT3:

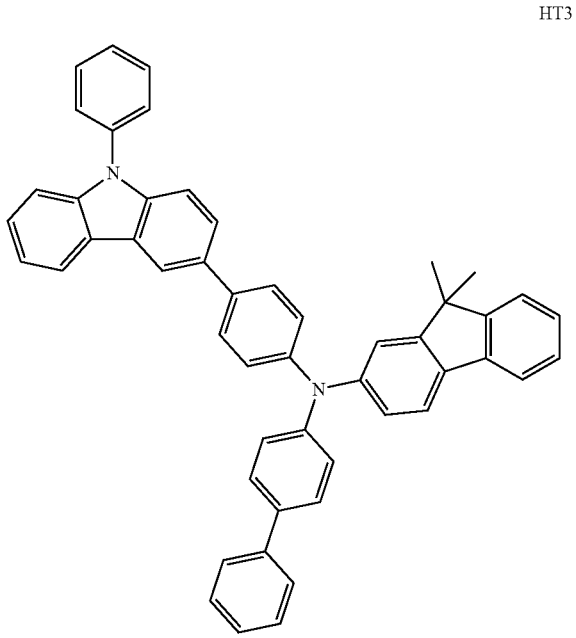 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

HT3 wherein the first one of the emission layers includes at least one of compounds represented by the following H39 and H45:

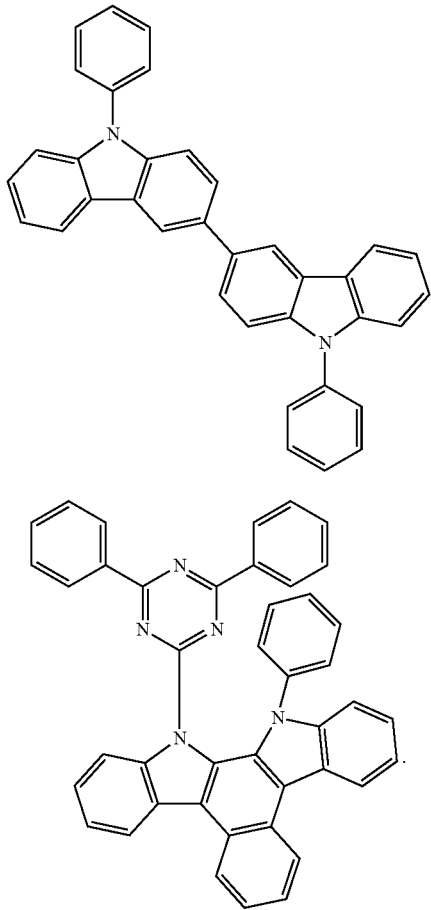

H39

H45

2. The organic light-emitting display device of claim 1, wherein the hole-transporting layer and the first auxiliary layer exclude a p-dopant.

3. The organic light-emitting display device of claim 1, wherein the hole mobility of the first one of the emission layers is about $5.0\times10^{-6}$ cm$^2$/V·s to about $5.0\times10^{-7}$ cm$^2$/V·s.

4. The organic light-emitting display device of claim 1, wherein the hole-transporting layer and the first auxiliary layer are formed from substantially the same material.

5. The organic light-emitting display device of claim 1, further comprising a hole-injection layer disposed between the plurality of pattern electrodes and the hole-transporting layer.

6. The organic light-emitting display device of claim 5, wherein the first auxiliary layer is disposed between the hole-transporting layer and the hole-injection layer.

7. The organic light-emitting display device of claim 1, wherein the first auxiliary layer is disposed between the hole-transporting layer and the first one of the emission layers to at least partially contact the first one of the emission layers.

8. The organic light-emitting display device of claim 1, further comprising an electron-transporting layer disposed between the common electrode and the emission layers.

9. The organic light-emitting display device of claim 8, further comprising an electron-injection layer disposed between the electron-transporting layer and the common electrode.

10. The organic light-emitting display device of claim 1, wherein a second one of the emission layers overlaps a second one of the pattern electrodes and comprises a host and a dopant to emit a red light, and a third one of the emission layers overlaps a third one of the pattern electrodes and comprises a host and a dopant to emit a blue light.

11. The organic light-emitting display device of claim 10, further comprising a second auxiliary layer disposed between the second pattern electrode and the second one of the emission layers and including a hole-transporting material.

12. The organic light-emitting display device of claim 1, wherein the hole-transporting layer has a thickness of about 100 Å to about 1,000 Å.

13. The organic light-emitting display device of claim 1, wherein the emission layers have a thickness of about 100 Å to about 1,000 Å.

14. The organic light-emitting display device of claim 1, the hole-transporting layer and the first auxiliary layer have a hole mobility equal to or less than about $1.0\times10^{-5}$ cm$^2$/V·s.

15. The organic light-emitting display device of claim 1, the interface has an electron barrier equal to or less than about 0.3 eV.

16. The organic light-emitting display device of claim 15, wherein the electron barrier of the interface is about 0.1 eV to about 0.2 eV.

17. The organic light-emitting display device of claim 1, wherein the hole-transporting layer and the first auxiliary layer have a hole concentration equal to or less than about $2.0\times10^{18}$/cm$^3$.

18. The organic light-emitting display device of claim 17, wherein the hole concentration of the hole-transporting layer and the first auxiliary layer is equal to or less than about $1.0\times10^{18}$/cm$^3$.

\* \* \* \* \*